United States Patent [19]
Sugiyama et al.

[11] Patent Number: 5,867,319
[45] Date of Patent: Feb. 2, 1999

[54] ILLUMINATION OPTICAL SYSTEM, AN EXPOSURE APPARATUS HAVING THE ILLUMINATION SYSTEM, AND A METHOD FOR MANUFACTURING A SEMICONDUCTOR DEVICE

[75] Inventors: Kayo Sugiyama, Yokohama; Yuji Kudo, Kawasaki; Osamu Tanitsu, Funabashi, all of Japan

[73] Assignee: Nikon Corporation, Tokyo, Japan

[21] Appl. No.: 803,929

[22] Filed: Feb. 21, 1997

[30] Foreign Application Priority Data

Oct. 25, 1996 [JP] Japan .................................... 8-301086
Dec. 13, 1996 [JP] Japan .................................... 8-353023

[51] Int. Cl.$^6$ ............................ G02B 27/10; F21V 29/00
[52] U.S. Cl. ........................................ 359/618; 362/268
[58] Field of Search .................................. 359/619, 618, 359/626; 362/268; 355/67

[56] References Cited

U.S. PATENT DOCUMENTS 4,947,030   8/1990   Takahashi .......................... 250/201.1
5,237,367   8/1993   Kudo ...................................... 355/67

FOREIGN PATENT DOCUMENTS 4-225214   8/1992   Japan .
8-264432  10/1996   Japan .

*Primary Examiner*—Georgia Epps
*Assistant Examiner*—Ricky Mack
*Attorney, Agent, or Firm*—Shapiro and Shapiro

[57] ABSTRACT

A change in the optical characteristics which is caused by an unevenness of the intensity of illumination, following a change of the form or the size of a multiple light source, is corrected by an adjustment mechanism with a simple structure. This mechanism further comprises a first correction device (21, 14B) which corrects unevenness of the intensity of illumination generated on a plane to be irradiated due to a change of the form and the size of the multiple light source made by a change device(13), and a second correction device (22, 14A1) which corrects at least one of a change of the back focus of a condenser optical system and a change in the telecentricity of the illumination light on the irradiated plane caused due to a correcting operation of the first correction device.

44 Claims, 18 Drawing Sheets

ILLUMINATION OPTICAL SYSTEM, AN EXPOSURE APPARATUS HAVING THE ILLUMINATION SYSTEM, AND A METHOD FOR MANUFACTURING A SEMICONDUCTOR DEVICE

BACKGROUND OF THE INVENTION

1. Field of the Invention

The present invention relates to an illumination optical system and an exposure apparatus having the optical system, and particularly, to correction of a distribution of an intensity of illumination in an illumination optical system in a semiconductor projection exposure apparatus. Also, the present invention relates to a method for manufacturing a semiconductor device using the illumination optical system.

2. Related Background Art

In a semiconductor exposure apparatus, a light ray emitted from a light source is incident on an optical integrator, and a multiple light source which is constituted by a plurality of light source images is formed on the rear focal plane of the optical integrator. The light ray from the multiple light source is passed through an aperture stop which is formed in the vicinity of the rear focal plane of the optical integrator and then is caused to enter a condenser optical system. The aperture stop causes the form or the size of the multiple light source to change into a desired one in accordance with a desired illumination condition.

The light ray condensed by the condenser optical system illuminates a reticle (or a mask) in an overlapping manner through a reticle blind which is disposed in the condenser optical system. A pattern is formed on the reticle, and an illumination area of the pattern is determined by the reticle blind. The light passed through the pattern of the reticle is imaged on a wafer through a projection optical system. Thus, the reticle pattern is projection-exposed (transferred) onto the wafer.

The pattern formed on the reticle is highly integrated, so that it is inevitably required to obtain a uniform distribution of the intensity of illumination on the wafer in order to correctly transfer the pattern onto the wafer. To this end, it is required to design and arrange the optical integrator and the condenser optical system in such a manner that the distribution of the intensity of illumination on the wafer should be uniform. However, even if the optical integrator and the condenser optical system are designed and arranged such that the distribution of the intensity of illumination becomes uniform, an unevenness in the intensity of illumination may be generated due to an error, or the like, in manufacturing the apparatus so that a uniform distribution of the intensity of illumination can not be obtained. Therefore, a conventional exposure apparatus is arranged such that a correction is properly performed by moving a movable lens group which constitutes a part of the condenser optical system in the direction of the optical axis so as to reduce a degree of unevenness in the distribution of illumination, thereby obtaining a uniform distribution of the intensity of illumination.

Recently, attention is given to the fact that the sizes of the plurality of light source images formed by the optical integrator are changed by changing the aperture form of an aperture stop or the like arranged on the exit side of the optical integrator so as to change a coherency σ (σ=the aperture stop size/ the pupil size of the projection optical system) of the illumination, or that the forms of the plurality of light source images formed by the optical integrator are changed into those of annular band or the like so as to improve the original depth of focus or degree of resolution of the projection optical system.

However, it has been clearly seen from various kinds of repeated experiments, etc., that, together with such change of the aperture form of the aperture stop or the like arranged on the exit side of the optical integrator, an unevenness of the intensity of illumination occurs on a reticle which serves as a plane to be irradiated, or a wafer which serves as a photosensitive substrate.

Accordingly, the present invention has been conceived taking the above-mentioned problem into consideration, and an object of the invention is to provide an illumination optical system which can correct a fluctuation in an intensity distribution of illumination on an irradiated plane which follows a change of the form or the size of a secondary light source, and an exposure apparatus having such illumination optical system.

Also, as a result of further repeated experiments, or the like, it has been found that when at least a certain optical system (a movable lens, or the like) which constitutes the condenser optical system is moved in the direction of the optical axis in order to correct an unevenness in the intensity of illumination which is generated on an irradiated plane due to a change of the aperture form of an aperture stop or the like arranged on the exit side of the optical integrator, the optical characteristics such as the back focus or the telecentricity of the condenser optical system are changed to deteriorate the illumination condition, owing to the movement of the optical system.

Accordingly, another object of the present invention is, taking the above-mentioned problem into consideration, to provide an illumination optical system which can correct a change in optical characteristics generated due to the correction of the unevenness in the intensity of illumination following the change of the form or the size of the multiple light source by use of an adjusting mechanism of a simple structure, and an exposure apparatus provided with the illumination optical system.

SUMMARY OF THE INVENTION

In order to solve the above-mentioned problem, according to an aspect of the present invention, there is provided an illumination optical system which comprises a multiple light source forming device which forms multiplicity of secondary light sources on the basis of light rays from a light source, a change device which changes the form or the size of the multiple light source formed by the multiple light source forming device, and a condenser optical system which illuminates a plane to be irradiated in an overlapping manner by condensing light rays from the multiple light source having a form or size predetermined by the change device, wherein at least certain optical elements of the condenser optical system are moved in accordance with the changed form or size of the multiple light source by the change device so that the distribution of the intensity of illumination on the irradiated plane becomes substantially uniform.

In this case, it is preferable that the multiple light source forming device has an optical integrator which is constituted by multiplicity of lens elements and the change device has a variable aperture stop having a variable aperture which sets the secondary light source formed by the optical integrator to have a predetermined form or a predetermined size.

Also, according to another aspect of the present invention, there is provided an exposure apparatus for forming a pattern image of the mask on a photosensitive substrate which comprises:

an illumination optical system which illuminates a mask having a predetermined pattern formed thereon, the illumination optical system comprises having a multiple light source forming device which forms a multiplicity of secondary light sources on the basis of light rays from a light source, a change device which changes the form or the size of the multiple light source formed by the multiple light source forming device, and a condenser optical system which illuminates a plane to be irradiated in an overlapping manner by condensing the light rays from the multiple light source having a form or a size predetermined by the change device, wherein at least certain optical elements of the condenser optical system are moved in accordance with the changed form or size of the multiple light source by the change device in such a manner the distribution of the intensity of illumination on the irradiated plane becomes substantially uniform.

In this case, it is preferable that the multiple light source forming device has an optical integrator which is constituted by a multiplicity of lens elements, and the change device has a variable aperture stop which has a variable aperture for setting the secondary light source formed by the optical integrator to have a predetermined form or a predetermined size.

Further, in order to solve the above-mentioned problem, according to yet another aspect the present invention, there is provided an illumination optical system provided with a light source device which supplies light rays, an optical integrator which forms a multiple light source consisting of a plurality of light source images on the basis of the light rays from the light source device, a change device which changes the form or the size of the multiple light source formed by the optical integrator, and a condenser optical system which illuminates a plane to be irradiated in an overlapping manner by condensing the light rays from the multiple light source having the form or the size changed by the change device, the illumination optical system further comprising:

a first correction device for correcting an unevenness in the intensity of illumination which is generated on the irradiated plane due to the change of the form or the size of the multiple light source made by the change device; and a second correction device for correcting at least one of a change in the back focus of the condenser optical system and a change in the telecentricity of the illumination light on the irradiated plan, due to the correcting operation by the first correction device.

According to a preferable embodiment of the present invention, the first correction device corrects the unevenness in the intensity of illumination by moving the first optical system for constituting the first portion of the condenser optical system along the optical axis of the condenser optical system, the second correction device corrects a change in the back focus of the condenser optical system by changing the focal length of the second optical system for constituting the second portion of the condenser optical system which is different from the first optical system. In this case, the second correction device preferably has a plurality of back focus correction optical systems each having a different focal length from that of the second optical system and an exchange device for setting one of the plurality of back focus correction optical systems in an illumination light path, instead of the second optical system.

Also, according to the present invention, there is provided an exposure apparatus which is provided with a light source device for supplying light rays, an optical integrator for forming a multiple light source consisting of a plurality of light source images on the basis of the light rays from the light source device, a change device for changing the form or the size of the multiple light source which is formed by the optical integrator, a condenser optical system for illuminating a mask in an overlapping manner by condensing the light rays from the multiple light source having the form or the size changed by the change device, and a projection optical system for performing a projection-exposure of a pattern on the mask onto a photosensitive substrate, the exposure apparatus further comprising:

a first correction device for correcting unevenness in the intensity of illumination which is generated on the mask or the photosensitive substrate due to the change of the form or the size of the multiple light source made by the change device; and a second correction device for correcting at least one of a change in the back focus of the condenser optical system and a change in the telecentricity of the illumination light on the mask or the photosensitive substrate which are generated due to the correcting operation by the first correction device.

According to such preferable embodiment of the present invention, a second optical integrator for forming a multiple light source which is constituted by a plurality of light source images is provided between the light source device and the optical integrator on the basis of the light rays from the light source device; and the light rays from the multiple light source formed by the second optical integrator are guided to the optical integrator which is arranged at a position closer to the irradiated plane than the optical integrator.

Also, according to the present invention, there is provided a method for manufacturing a semiconductor device, which comprises a step of exposing a pattern of a mask arranged on the irradiated plane onto the photosensitive substrate by use of an illumination optical system of the present invention.

DESCRIPTION OF THE PREFERRED EMBODIMENTS

Figure 1:
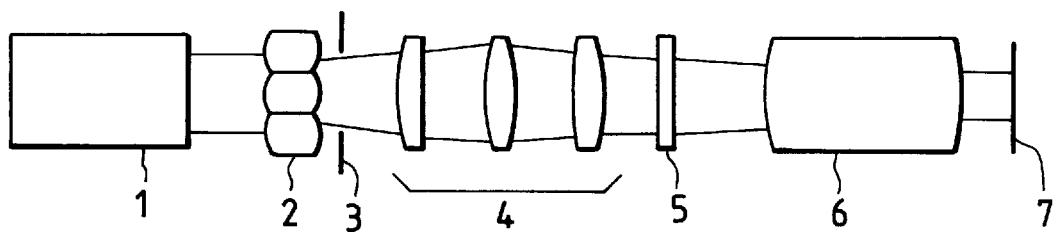
FIG. 1 is a view for schematically showing the structure of an exposure apparatus having an illumination optical system according to an embodiment of the present invention.

First, description will be made on a fluctuation in a distribution of the intensity of illumination on a plane to be irradiated, which is caused by a change of an aperture form, that is, a change of the form or the size of a secondary light source.

On the surface of each lens which constitutes an exposure apparatus, a reflection-preventing film is deposited by vaporization in order to improve the transmittance of the lens. However, the film thickness of the reflection-preventing film over the entire lens surface is not necessarily uniform owing to the curved surface from of each lens. For this reason, the transmittance of the lens surface is characterized by being different in accordance with the surface position thereof.

Generally, when the reflection-providing film is deposited by evaporation onto the lens surface, the reflection-preventing film is formed to be a little thinner on the peripheral part of the lens surface than the central part thereof. As stated, since the reflection-preventing film on the lens surface is thinner as it is separated farther from the central axis (optical axis), the transmittance of the light ray also tends to be lower as it is separated farther from the optical axis.

Also, the reflection-preventing film is arranged to prevent most satisfactorily the reflection of the light ray which is incident on the surface of the reflection-preventing film. Therefore, the transmittance of the light ray declines more as the incident angle of the light ray on the surface of the reflection-preventing film becomes larger. In general, the incident angle of the light ray onto the lens surface becomes larger as it is separated farther from the optical axis, so that the transmittance of the light ray declines more as it is separated farther from the optical axis.

As stated before, the light ray which is passed through the lens surface separated from the optical axis tends to damage the uniformity of the distribution of the intensity of illumination on a wafer surface under the influence of the change of the film thickness of the reflection-preventing film and the change of the incident angle onto the reflection-preventing film.

More specifically, an area of each lens surface through which the light ray is passed via an aperture stop is changed, by changing the aperture form of the aperture stop with respect to the secondary light source. As a result, upon reception of the influence of the change of the film thickness of the reflection-preventing film on each lens surface and the change of the incident angle on the reflection-preventing film, a fluctuation is generated in the distribution of the intensity of illumination on the irradiated plane.

Next, with reference to FIGS. 6A to 8B, the fluctuation in the distribution if the intensity of illumination caused by the change of the aperture form of the aperture stop will be specifically described.

Note that FIGS. 6A to 6E are views which respectively show various aperture forms of the aperture stop. Also, FIGS. 7A to 7C and FIGS. 8A and 8B are views for showing distributions of the intensity of illumination which respectively correspond to the aperture forms shown in FIGS. 6A to 6E.

In a projection exposure apparatus, the aperture form of the aperture stop is changed in order to improve the illumination efficiency of the illumination optical system, with the intention of improving a degree of resolution and the depth of focus of the projection optical system.

Figure 6A:
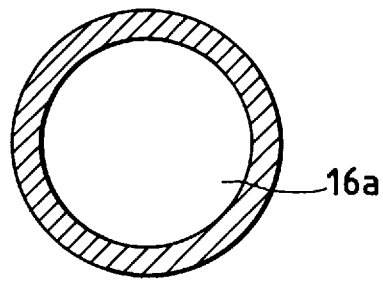
FIGS. 6A to 6E are views for respectively showing various aperture forms of the aperture stop.
Figure 6B:
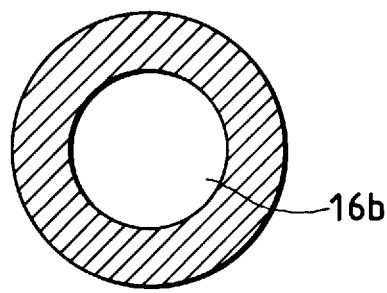
Figure 6C:
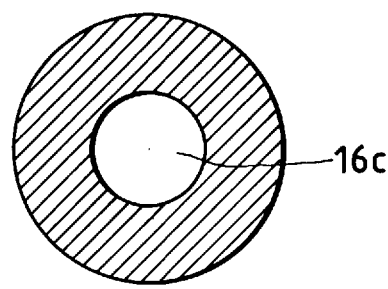

First, FIGS. 6A to 6C show aperture stops which have circular aperture portions 16a to 16c with different aperture sizes.

Figure 7A:
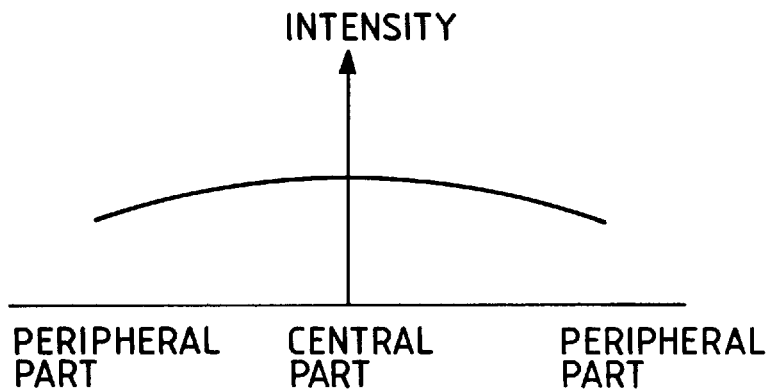
FIGS. 7A to 7C are views each for showing a distribution of the intensity of illumination corresponding to each of the aperture forms shown in FIGS. 6A to 6C, respectively.
Figure 7B:
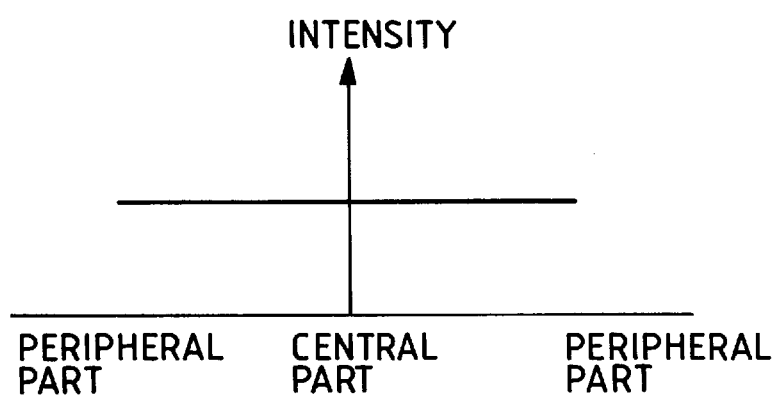

Here, it is assumed that the distribution of the intensity of illumination with respect to the aperture form of the aperture portion 16b is adjusted to be substantially uniform from the central part to the peripheral part of the irradiated plane, as shown in FIG. 7B. In this case, if the aperture size is made large, like the aperture portion 16a, the distribution of the intensity of illumination shown in FIG. 7A can be obtained. That is, with the increase of the aperture size, the distribution of the intensity of illumination fluctuates in such a manner that the light intensity gradually decreases from the central part to the peripheral part of the irradiated plane.

Figure 7C:
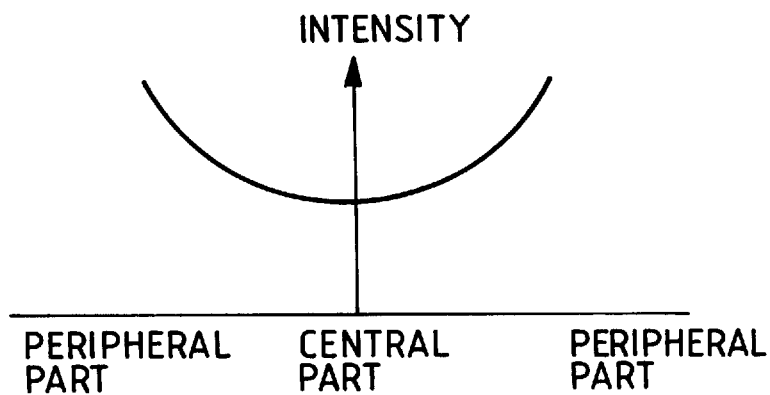

On the other hand, when the aperture size is decreased to be like the aperture portion 16c from the state in which the distribution of the intensity of illumination is adjusted to be substantially uniform with respect to the aperture portion 16b, the distribution of the intensity of illumination shown in FIG. 7C can be obtained. That is, with the decrease of the aperture size, the distribution of the intensity of illumination fluctuates in such a manner that the light intensity gradually increases from the central part to the peripheral part of the irradiated plane.

Figure 6D:
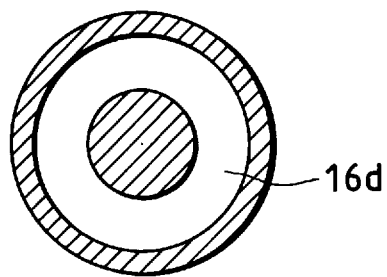
Figure 6E:
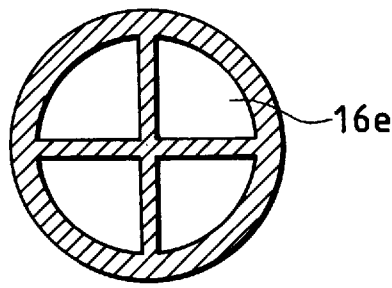

Next, FIGS. 6D and 6E show an aperture stop having an aperture portion 16d in the form of an annular band, and an aperture stop having a fan-shaped aperture portion 16e.

Figure 8A:
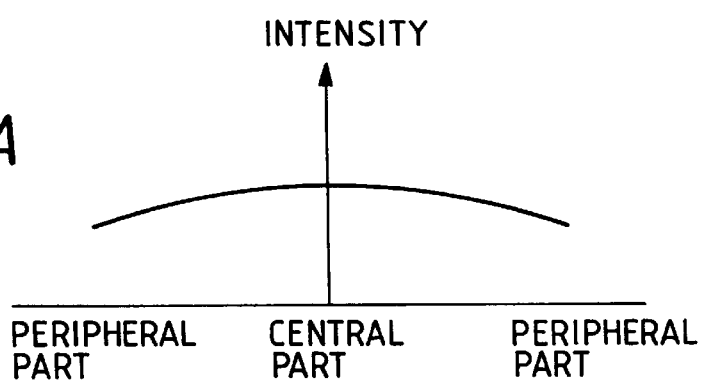
FIGS. 8A and 8B are views each for showing the distribution of the intensity of illumination corresponding to each of the aperture forms shown in FIGS. 6A to 6D to 6E, respectively.

Here, when the aperture form is changed from a state in which the distribution of the intensity of illumination is adjusted to be substantially uniform with respect to the aperture portion 16b to the aperture form of the aperture portion 16d in the form of an annular band, the distribution of the intensity of illumination shown in FIG. 8A can be obtained. That is, with the change of the aperture form, the distribution of the intensity of illumination fluctuates in such a manner that the light intensity gradually decreases from the central part to the peripheral part of the irradiated plane.

Figure 8B:
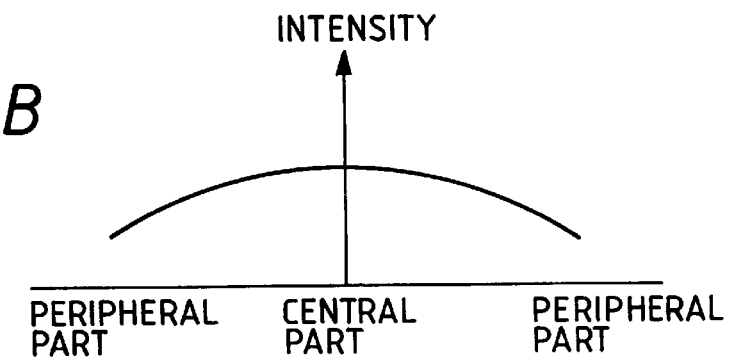

When the aperture form is changed from a state in which the distribution of the intensity of illumination is adjusted to be substantially uniform with respect to the aperture portion 16b to the aperture form of the fan-shaped aperture portion 16e, the distribution of the intensity of illumination shown in FIG. 8B can be obtained. That is, with the change of the aperture form, the distribution of the intensity of illumination fluctuates in such a manner that the light intensity gradually decreases from the central part to the peripheral part of the irradiated plane.

Thus, in the same illumination optical system, if only the aperture form of the aperture stop is changed, the illumination distribution on the irradiated plane may fluctuate so that the uniformity of the distribution of the intensity of illumination may be damaged.

Then, according to the present invention, at least one lens out of a lens group for constituting, for example, a condenser optical system, is properly moved along the optical axis in accordance with the change of the aperture form, i.e., the form or the size of the secondary light source, in such a manner that the distribution of the intensity of illumination on the irradiated plane is substantially uniform. Thus, the fluctuation in the distribution of the intensity of illumination caused by the change of the aperture form can be immediately corrected so as to always maintain the uniformity thereof satisfactorily.

As stated above, in order to correctly transfer a highly integrated mask pattern onto a wafer, it is inevitably necessary that the distribution of the intensity of illumination on the wafer should be uniform. Therefore, it is required to design and arrange a multiple light source forming device such as an optical integrator and a condenser optical system in such a manner that the distribution of the intensity of illumination should be uniform. However, when the uniformity of the distribution of the intensity of illumination can not be obtained due to a manufacturing error or the like, adjustment is required for making the distribution of the intensity of illumination to be uniform. The condenser optical system is frequently used in such an adjustment.

The condenser optical system is generally constituted by a plurality of lenses, and when at least one of these lenses is moved along the direction of the optical axis, the distribution of the intensity of illumination on the irradiated plane changes in accordance with a direction and an amount of such movement. In other words, the uniformity of the distribution of the intensity of illumination can be easily improved by properly controlling the direction of movement and an amount of movement of at least one lens out of the plurality of lenses which constitute the condenser optical system.

An embodiment of the present invention will be described with reference to the attached drawings.

FIG. 1 is a view for schematically showing the structure of an exposure apparatus which is provided with an illumination optical system according to the first embodiment of the present invention.

The apparatus shown in FIG. 1 is provided with a light source 1 which supplies collimated light rays. The collimated light rays from the light source 1 are incident on an optical integrator 2 such as a fly-eye lens. The light rays incident on the optical integrator 2 are two-dimensionally divided by a plurality of lens elements which constitute the optical integrator 2, and thereafter form a multiplicity of light source images, i.e., secondary light sources, at the rear focal positions of the optical integrator 2. Thus, the optical integrator 2 constitutes a multiple light source forming device for forming a multiplicity of secondary light sources based on the light rays from the light source 1.

The light rays from the multiplicity of light source images are, after controlled by an aperture stop 3 having a variable aperture, incident on a condenser optical system 4 which is constituted by a plurality of lenses. The light through the condenser optical system 4 illuminates a mask 5 with a predetermined pattern formed thereon in an overlapping manner.

The light rays passed through the mask 5 reach through a projection optical system 6 to a wafer 7 which is positioned at an image plane thereof. Thus, the pattern of the mask 5 is transferred onto the wafer 7 which serves as a photosensitive substrate.

As stated, the light source 1, the optical integrator 2, the aperture stop 3, and the condenser optical system 4 constitute the illumination optical system for illuminating the mask.

FIGS. 2 to 5 are views which explain an operation for correcting a fluctuation in a distribution of the intensity of illumination caused by a change of the aperture form of the aperture stop 3.

In FIGS. 2 to 5, the aperture form of the aperture stop 3 can be changed by a changing system 8 in order to obtain a desired illumination condition, and the light rays from the secondary light source formed through the optical integrator 2 are limited into a desired form. Also, the aperture stop 3 is made to be optically conjugate the pupil plane of the projection optical system 6 by use of the condenser optical system 4. Therefore, it is possible to arbitrarily change a range for the illumination light rays on the pupil plane of the projection optical system 6, by changing the aperture form of the aperture stop 9 (the form or the size of the variable aperture).

Also in FIGS. 2 to 5, in accordance with a change of the aperture form of the aperture stop 3, a lens 4a out of the plurality of lenses for constituting the condenser optical system 4 is moved along the optical axis by a movement system 9 to a predetermined position. Upon this movement of the lens 4a, it is possible to change the distribution of the intensity of illumination on the wafer and to minimize an unevenness in the intensity of illumination.

However, upon movement of the lens 4a, a change of the focal length of the condenser optical system or a fluctuation in the telecentricity is generated. For this reason, in order to obtain a desired uniformity with respect to the distribution of the intensity of illumination while maintaining substantially the same optical condition as that prior to the change of the aperture form of the aperture stop 3, it is required to constitute the lens system in such a manner that the lens system is not susceptible to a change which is caused by the movement of the lens 4a, and the change caused by the movement of the lens 4a can be easily corrected.

Figure 2:
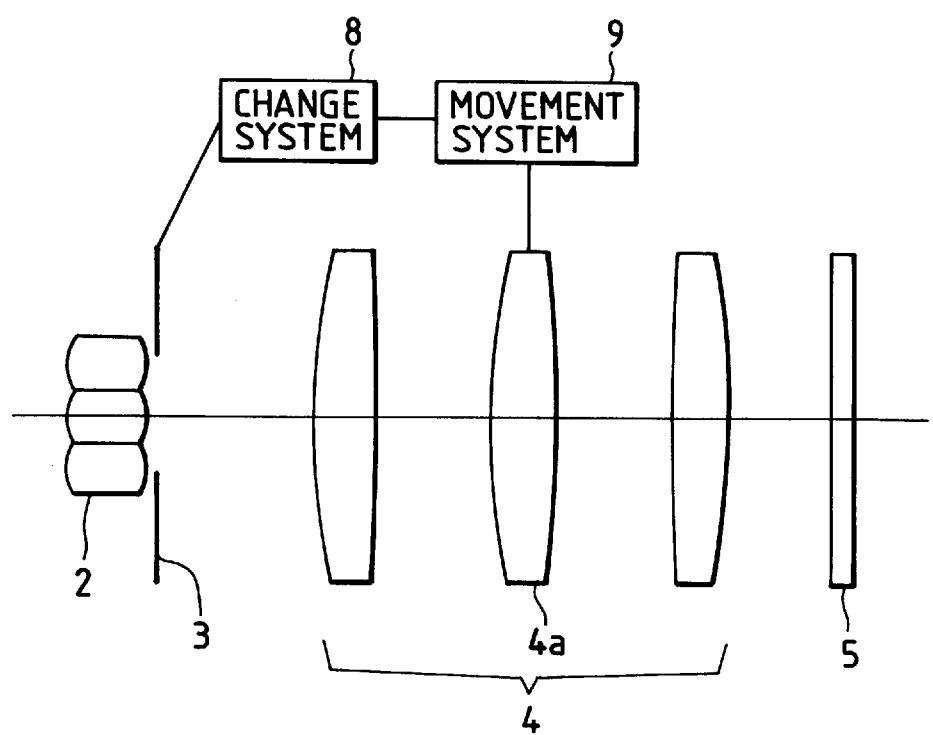
FIG. 2 is a view for explaining an operation for correcting a fluctuation in a distribution of the intensity of illumination caused by a change of the form of an aperture stop 3 shown in FIG. 1.

In FIG. 2, the aperture stop 3 is arranged to have a circular aperture portion 16b, as shown in FIG. 6B. Then, the distribution of the intensity of illumination on the wafer 7 is adjusted substantially uniformly over a projection area of the projection optical system 6 from the central part to the peripheral part thereof, as shown in FIG. 7B.

In the following, with the condition in FIG. 2 as the reference condition, a correction operation on a distribution of the intensity of illumination when the aperture form of the aperture stop 3 is changed into the form shown in FIG. 6C, to FIG. 6A and to FIG. 6D, will be described referring to FIGS. 3 to 5.

Figure 3:
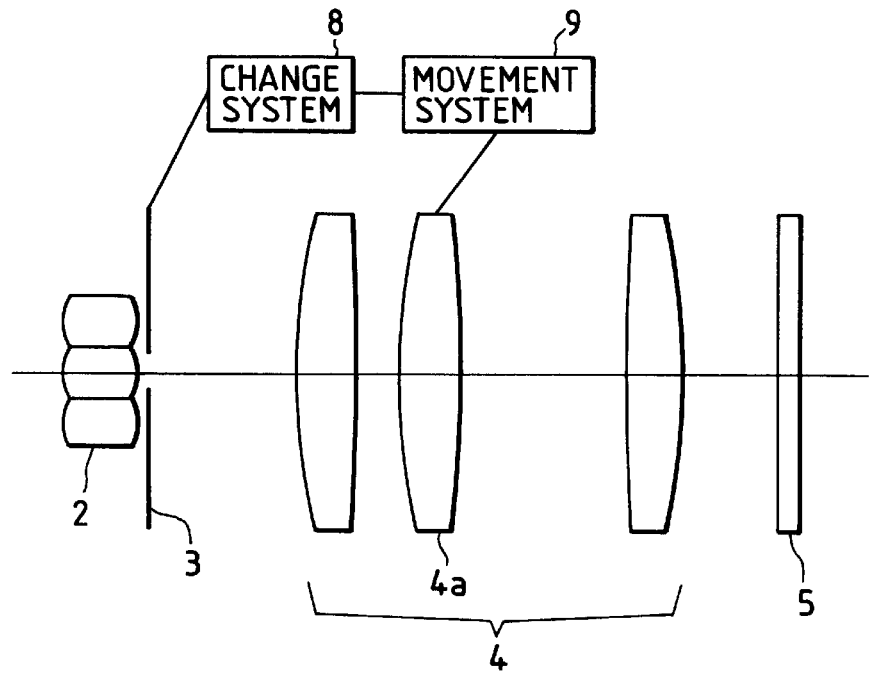
FIG. 3 is a view for explaining an operation for correcting a fluctuation in the distribution of the intensity of illumination caused by a change of the form of the aperture stop 3 shown in FIG. 1.

In FIG. 3, the aperture form is changed into the form shown in FIG. 6C, in such a manner that the aperture size of the aperture stop 3 is decreased. Therefore, as shown in FIG. 7C, the distribution of the intensity of illumination on the wafer 7 fluctuates due to a change of the aperture form, so that such distribution in which the intensity of illumination gradually increases from the central part to the peripheral part can be obtained.

Note that, the lens 4a of the condenser optical system 4 has a function of decreasing the intensity of illumination from the central part toward the peripheral part with its movement to the optical integrator side, and a function of increasing the intensity of illumination from the central part toward the peripheral part with its movement to the mask side.

Accordingly, in FIG. 3, a fluctuation in the distribution of the intensity of illumination which is caused by a change of the aperture form is corrected, by moving the lens 4a of the condenser optical system 4 using the movement system 9 along the optical axis to the side of the optical integrator 2 by a predetermined amount. As a result, on the wafer 7, a substantially uniform distribution of the intensity of illumination can be maintained without depending on a change of the aperture form.

Figure 4:
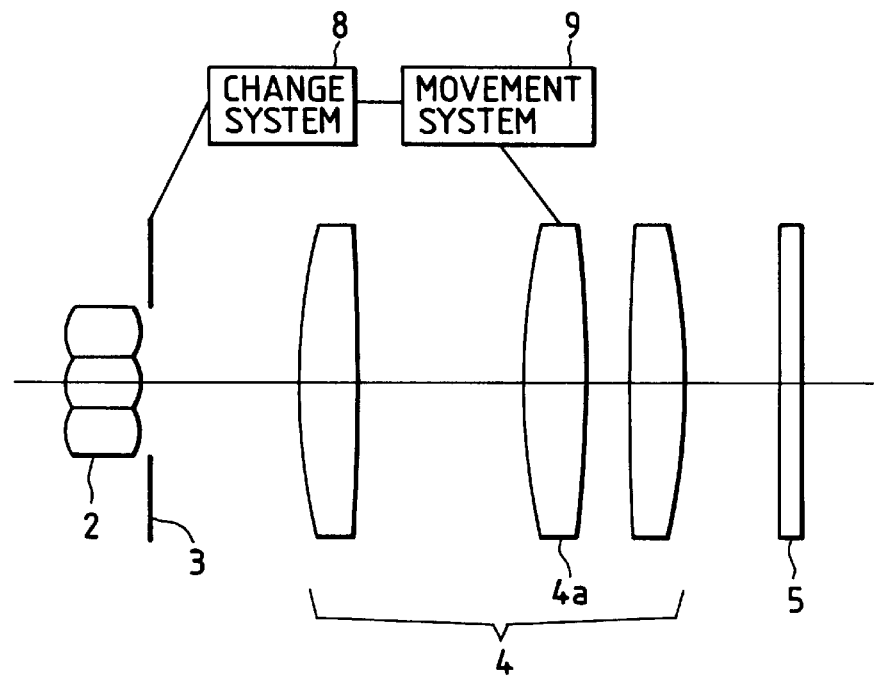
FIG. 4 is a view for explaining an operation for correcting a fluctuation in the distribution of the intensity of illumination caused by a change of the form of the aperture stop 3 shown in FIG. 1.

In FIG. 4, the aperture form is changed into the form shown in FIG. 6A in such a manner that the aperture size of the aperture stop 3 is increased. Therefore, as shown in FIG. 7A, the distribution of the intensity of illumination on the wafer 7 fluctuates due to the change of the aperture form, so that such distribution in which the intensity of illumination gradually decreases from the central part to the peripheral part can be obtained.

Accordingly, in FIG. 4, a fluctuation in the distribution of the intensity of illumination caused by a change of the aperture form is corrected, by moving the lens 4a of the condenser optical system 4 through the movement system 9 along the optical axis to the mask side by a predetermined amount. As a result, on the wafer 7, a substantially uniform distribution of the intensity of illumination can be maintained without depending on the change of the aperture form.

Figure 5:
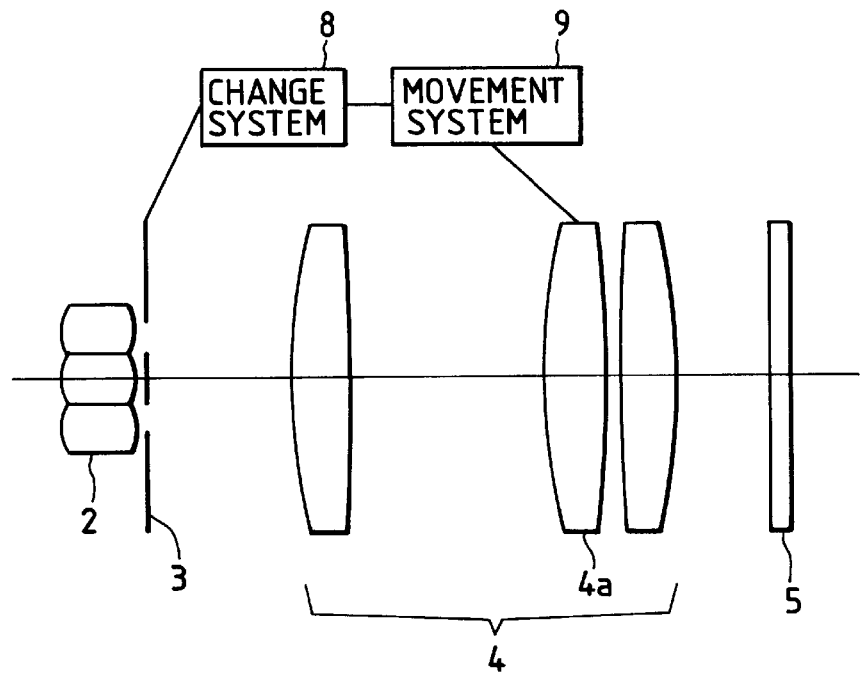
FIG. 5 is a view for explaining an operation for correcting a fluctuation in the distribution of the intensity of illumination caused by a change of the form of the aperture stop 3 shown in FIG. 1.

In FIG. 5, the aperture form of the aperture stop 3 is changed into a form of an annular band, as shown in FIG. 6D. Therefore, as shown in FIG. 8A, the distribution of the intensity of illumination on the wafer 7 fluctuates owing to the change of the aperture form, so that such distribution in which the intensity of illumination gradually decreases from the central part to the peripheral part can be obtained.

Accordingly, in FIG. 5, in the same manner as in FIG. 4, a fluctuation in the distribution of the intensity of illumination caused by the change of the aperture form is corrected, by moving the lens 4a of the condenser optical system 4 through the movement system 9 along the optical axis to the mask side by a predetermined amount. As a result, on the wafer 7, a substantially uniform distribution of the intensity of illumination can be maintained without depending on the change of the aperture form.

In the above-mentioned embodiment, the form or the size of the secondary light source is changed by changing the form or the size of the variable aperture of the aperture stop. However, as disclosed in Japanese Patent Laid-Open Application No. 4-225514, it is also possible to change the form or the size of the secondary light source, by changing the sizes of four eccentric light sources or properly changing the form of a fly-eye lens or a combination of fly-eye lenses. The present invention is effective for the correction of a fluctuation in a distribution of the intensity of illumination caused by the change of the form or the size of the secondary light source, without depending on a method of changing thereof.

Also, in the above-mentioned embodiment, the present invention was explained by using the projection exposure apparatus with an illumination optical system as example. However, it is apparent that the present invention can be applied to an exposure apparatus of a proximity scheme, or an illumination optical system of an ordinary type for uniformly illuminating an irradiated plane other than the mask.

Further, in the above-mentioned embodiment, one lens which constitutes the condenser optical system was moved along the optical axis. However, it is possible to move a plurality of lenses for constituting the condenser optical system.

Also, when an asymmetric unevenness in the intensity of illumination is generated on the irradiated plane, it is also possible to correct the asymmetric unevenness component in the intensity of illumination by shifting the lens or the lens group in the direction of the optical axis or tilting the same with respect to the optical axis.

Further, according to the present invention, a first optical system which constitutes, for example, a first portion of the condenser optical system is moved along the optical axis, so as to correct an unevenness in the intensity of illumination which is caused by a change of the form or the size of the multiple light source. Then, at least a change in the back focus of the condenser optical system which is caused by this correction of unevenness in the intensity of illumination or a change in the telecentricity of the illumination light on the irradiated plane is corrected. More specifically, the change in the back focus of the condenser optical system is corrected by changing the focal length of a second optical system for constituting a second portion of the condenser optical system which is different from the first optical system, for example, by setting a back focus correction optical system which has a different focal length into the illumination light path, instead of, the second optical system. Also, the change in the telecentricity of the illumination light on the irradiated plane is corrected by changing the optical light path length of the optical member for constituting a third portion of the condenser optical system which is different from the first optical system or the second optical system, for example, by setting a light path length correction optical member having a different thickness into the illumination optical light path instead of the optical member.

As stated above, according to the present invention, the change in the back focus of the condenser optical system or in the illumination light on the irradiated plane can be properly corrected, only by exchanging optical systems or optical members which constitute a part of the condenser optical system, without moving a lens group which is different from the movable lens group in the direction of the optical axis as in the conventional example. As a result, even when the form or the size of the multiple light source is changed in accordance with a desired illumination condition, the change in the back focus of the condenser optical system or in the telecentricity of the illumination light on the irradiated plane can be properly changed so that a uniform distribution of the intensity of illumination can be always obtained on the irradiated plane. Therefore, when the illumination optical system of the present invention is incorporated in an exposure apparatus, a projection-exposure with a high accuracy can be performed by maintaining a uniform distribution of the intensity of illumination on the photosensitive substrate and an excellent telecentricity of the exposure light. Also, according to a method for manufacturing a semiconductor device which comprises a step of exposing the pattern of a mask arranged on an irradiated plane onto a photosensitive substrate by use of the illumination optical system of the present invention, projection exposure can be conducted with a high accuracy by maintaining a uniform distribution of the intensity of illumination on the photosensitive substrate and an excellent telecentricity of the exposure light, so that an excellent semiconductor device can be manufactured.

Note that, according to the present invention, only a change in the telecentricity on the irradiated plane can be corrected by changing the optical light path length of the optical member which constitutes a part of the condenser optical system and has substantially no refracting power. More specifically, the optical member has, for example, a plurality of plane parallel plates with thicknesses different from each other, and sets each of the plurality of plane parallel plates into the illumination light path or retracts it from the illumination light path, so as to change the optical light path length of the optical member. Or, the optical member has, for example, a pair of declination prisms, and one of these declination prisms is moved along a direction perpendicular to the optical axis, so as to change the optical light path length of the optical member. In this case, the optical member having no refracting power is disposed near to the optical member in the condenser optical system, whereby only a change in the telecentricity of the illumination light on the irradiated plane can be properly corrected without giving little influence onto the back focus or aberrations of the condenser optical system.

Another embodiment of the present invention will be described with reference to the attached drawings.

Figure 9:
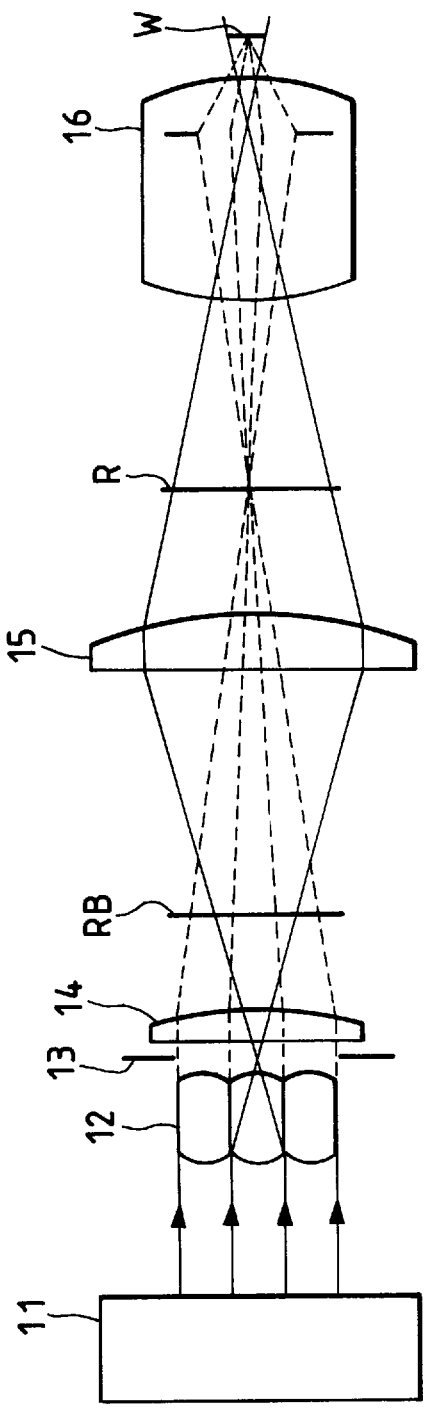
FIG. 9 is a view for schematically showing the structure of an exposure apparatus which has an illumination optical system according to second to fifth embodiments of the present invention.

FIG. 9 is a view for schematically showing the structure of an exposure apparatus having the illumination optical system according to the second to fifth embodiments of the present invention. And FIG. 10 is a perspective view for schematically showing the structure of a main portion of the illumination optical system according to the second embodiment of the present invention.

Referring to FIG. 9, a light ray emitted from a light source 11 enters an optical integrator 12, so as to form a multiple light source (secondary light source) consisting of a plurality of light source images on the rear focal plane of the integrator 12. The light ray from the multiple light source is passed through an aperture stop 13 which is formed near to rear focal plane of the optical integrator 12, and then enters a condenser optical system which is constituted by a lens group 14 and a lens group 15. The aperture stop 13 has a function of changing the form or the size of the multiple light source into a desired form or size in accordance with a desired illumination condition, as described later.

The light ray condensed by a condenser optical system (14, 15) is passed through a reticle blind RB which is arranged in the condenser optical system, and illuminates the reticle R serving as a mask in an overlapping manner. On the reticle R, an electronic circuit pattern, for example, is formed as a pattern to be transferred. The reticle blind RB has a function of specifying an illumination area on a pattern surface of the reticle R serving as a plane to be irradiated, i.e., a pattern area to be exposed. The light passed through the pattern of the reticle R is imaged on a wafer W serving as a photosensitive substrate through a projection optical system 16. Thus, patterns of the reticle R are projection-exposed (transferred) collectively on each exposure area on the wafer W.

Figure 10:
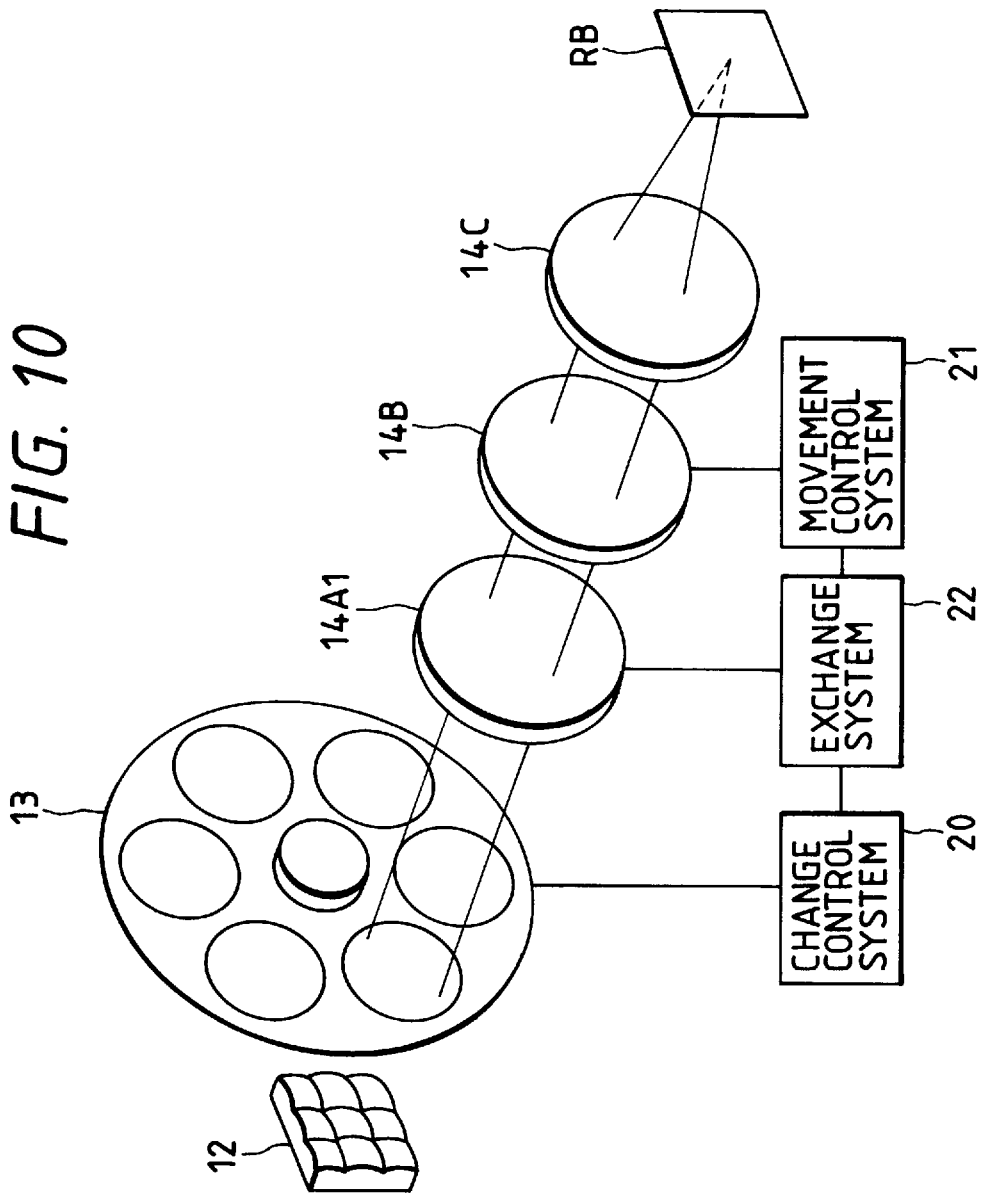
FIG. 10 is a view for schematically showing the structure of a main portion of the illumination optical system according to the second embodiment of the present invention.

Referring to FIG. 10, in the illumination optical system according to the third embodiment, the aperture stop 13 has a plurality of aperture portions which have different forms or sizes from each other and are circumferentially formed on a turret (rotating plate). Then, a rotation of the turret of the aperture stop 13 is arranged to be controlled by a change control system 20. Accordingly, when the aperture stop 13 is rotated by the change control system 20 so as to set an aperture portion having a desired form or size in the illumination light path, the form or the size of the multiple light source which is formed through the optical integrator 12 can be changed into a desired one.

In this manner, the aperture stop 13 and the change control system 20 constitute a change device which is used to change the form or the size of the multiple light source formed by the optical integrator 12.

As described above with reference to FIGS. 6A to 8B, in the same illumination optical system, a distribution of the intensity of illumination on the irradiated plane fluctuates only if the form or the size of the aperture portion of the aperture stop is changed, whereby the uniformity of the distribution of the intensity of illumination may be damaged.

Then, in the second embodiment, there is provided a device for correcting an unevenness in the intensity of illumination which is caused by a change of the form or the size of the aperture portion of the aperture stop 13. That is, in the illumination optical system of the second embodiment shown in FIG. 10, a lens group 14 of the condenser optical system is arranged to have a lens 14A1, a lens group 14B and a lens group 14C in that order from the aperture stop. Then, the lens group 14B is a movable lens group which is movable in the direction of the optical axis, and a movement of the lens group 14B is arranged to be controlled by a movement control system 21. Accordingly, when the lens group 14B is moved by the movement control system 21 which is interlocked with the change control system 20 in accordance with the change of the form or the size of the multiple light source, an unevenness in the intensity of illumination on the reticle R serving as an irradiated plane, and in its turn, on the wafer W can be corrected. In this manner, the movement control system 21 constitutes the first correction device for correcting an unevenness in the intensity of illumination which is generated on the irradiated plane due to the change of the form or the size of the multiple light source. Here, owing to the movement of the lens group 14B for correcting the unevenness in the intensity of illumination, optical characteristics of the illumination optical system are changed. In this case, the optical characteristics include a back focus of the condenser optical system, and the telecentricity, the numerical aperture, an illumination area, the light source distribution, aberrations, etc., of the illumination light on the irradiated plane (on the reticle R or on the wafer W).

In the following, with reference to FIGS. 13 to 16, it will be described that a correction of a change of the back focus of the condenser optical system is specially important out of changes of the optical characteristics caused by the movement of the movable lens group 14B which corrects the unevenness in the intensity of illumination.

Figure 13:
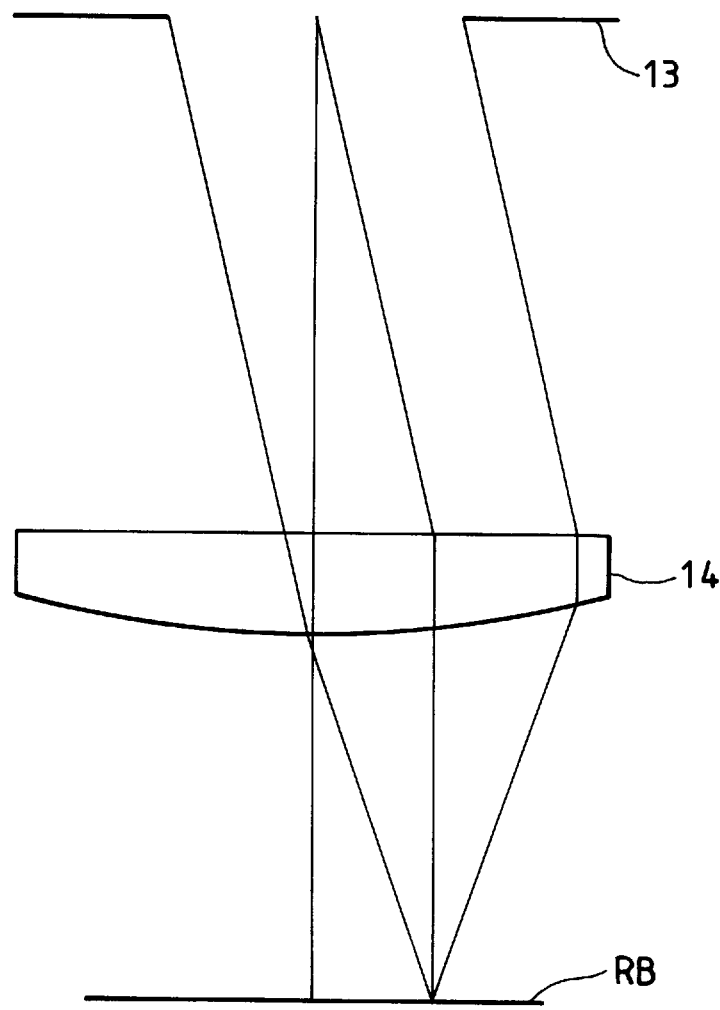
FIG. 13 is a view for showing an exposure apparatus of a step-and-repeat exposure type, in a condition prior to the change of the form or the size of a multiple light source.
Figure 14:
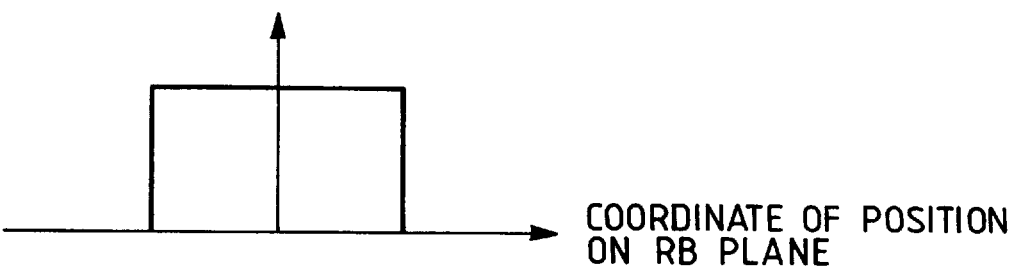
FIG. 14 is a view for showing an intensity distribution on a reticle blind RB in the condition shown in FIG. 13.

Referring to FIG. 13, when the back focus of the lens group 14 is adjusted in such a manner that the rear focal point of the lens group 14 is positioned on the reticle blind RB, the intensity distribution on the reticle blind RB takes a rectangular form, which is uniform over the entire area, as shown in FIG. 14.

Figure 15:
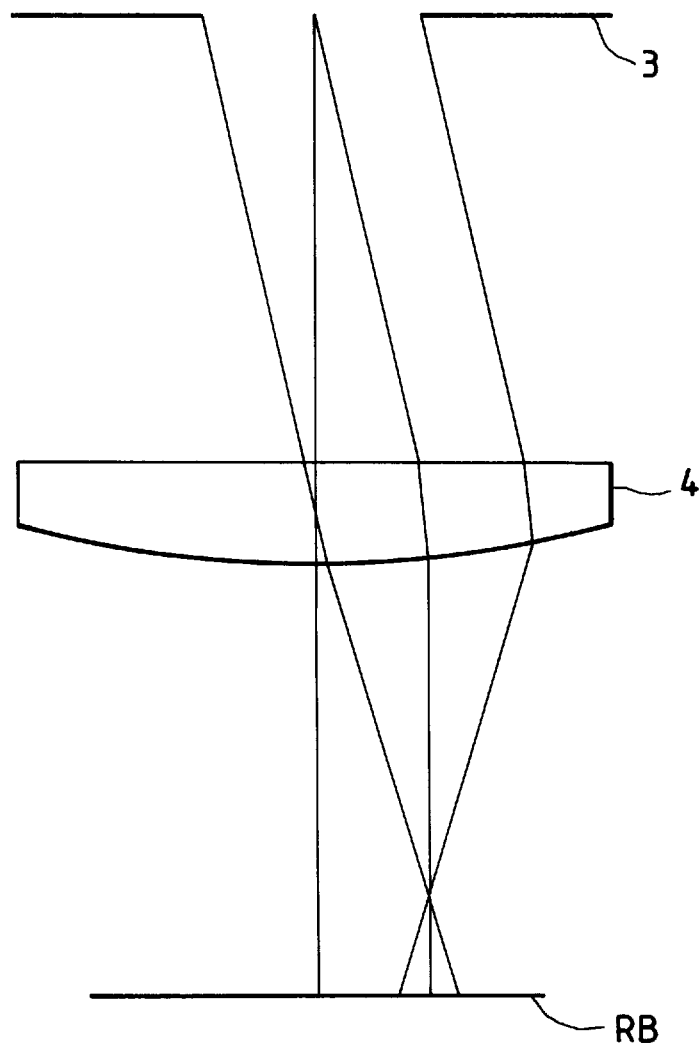
FIG. 15 is a view for showing the exposure apparatus of a step-and-repeat exposure type, in a condition after the change of the form or the size of the multiple light source.
Figure 16:
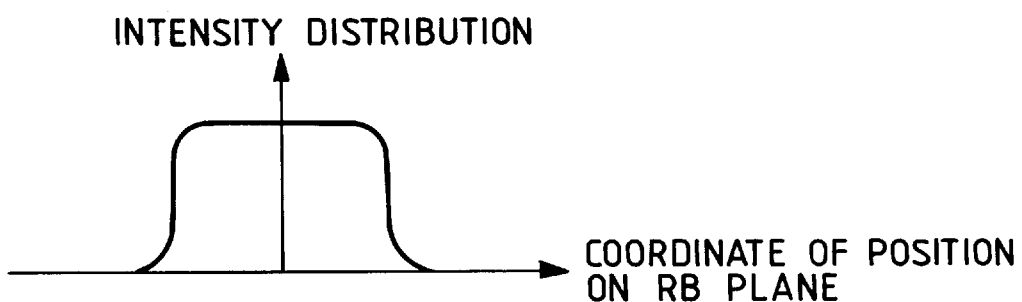
FIG. 16 is a view for showing an intensity distribution on a reticle blind RB in the condition shown in FIG. 15.

However, when the back focus of the lens group 14 is changed due to the movement of the movable lens group 14B for correcting the unevenness in the intensity of illumination, the rear focal point of the lens group 14 is displaced from the reticle blind RB, as shown in FIG. 15. As a result, as shown in FIG. 16, the corners of the rectangular form indicating the intensity distribution on the reticle blind RB are rounded to indicate that the distribution becomes uneven. This non-uniformity of the intensity distribution on the reticle blind RB reflects on the distribution of the intensity of illumination on the reticle R, and in its turn, the distribution of the intensity of illumination on the wafer W. Thus, it can be seen that the correction on the change of the back focus is specially important among the changes in the optical characteristics caused by the movement of the movable lens group 14B which corrects the unevenness in the intensity of illumination.

Accordingly, the illumination optical system of the second embodiment is provided with an exchange system 22 which comprises a plurality of correction lenses each having a different focal length and which exchanges the lens 14A1 for constituting a part of the condenser optical system with a predetermined correction lens out of the plurality of correction lenses. Note that the exchange system 22 is arranged to be interlocked with the change control system 20 and the movement control system 21. Therefore, when the lens 14A1 is exchanged with an appropriate correction lens having a different focal length by the exchange system 22, a change in the back focus caused by the movement of the movable lens group 14B can be corrected, and the intensity distribution on the reticle blind RB and, in its turn, the distribution in the intensity of illumination on the reticle R or on the wafer W can be returned into substantially the same states as those prior to the change of the form or the size of the multiple light source. In this manner, the exchange system 22 constitutes an exchange device which has a plurality of correction lenses each having a focal length different from that of the lens 14A1 and sets one of the correction lenses, instead of the lens 14A1, in the illumination light path.

As stated above, when the movable lens group 14B is moved to correct the unevenness in the intensity of illumination which is caused by the change of the form or the size of the multiple light source, the optical characteristics, especially the back focus of the condenser optical system, is changed due to the movement of the movable lens group 14B. In the second embodiment, the change of the back focus can be properly corrected only by exchanging the lens 14A1 which constitutes a part of the condenser optical system with another correction lens having a different focal length. As a result, even when the form or the size of the multiple light source is changed according to a desired condition, it is possible to properly correct the change in the back focus of the condenser optical system in a simple adjustment mechanism, and also, to obtain all the time a uniform distribution in the intensity of illumination on the reticle R or on the wafer W. Also, in the exposure apparatus in which the illumination optical system is incorporated, a projection exposure with a high accuracy can be performed by maintaining a uniform distribution in the intensity of illumination on the wafer W.

Figure 11:
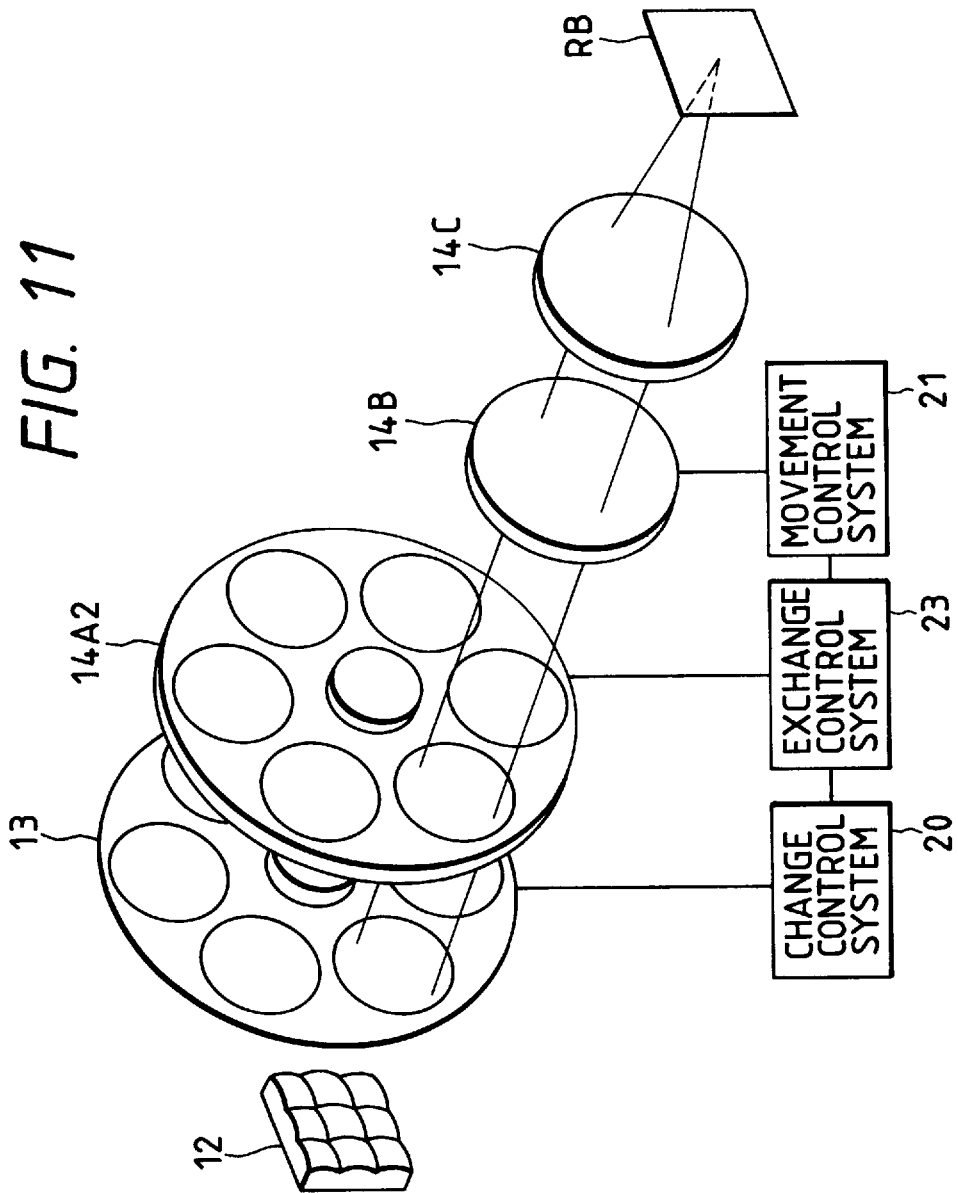
FIG. 11 is a view for schematically showing the structure of a main portion of the illumination optical system according to the third embodiment of the present invention.

FIG. 11 is a perspective view which schematically shows the structure of a main portion of an illumination optical system according to the third embodiment of the present invention.

The third embodiment has a similar structure to that of the second embodiment, except that the structure of an exchange device which corrects a change in the optical characteristics caused by a movement of a movable lens group 4B is different from that in the second embodiment. Accordingly, components in FIG. 11 having the same functions as those of the second embodiment in FIG. 10 are given the same reference numerals and symbols as in FIG. 10. The third embodiment will be described below by paying attention to the difference from the second embodiment.

As shown in FIG. 11, in the illumination optical system of the third embodiment, there is provided a turret 14A2 on which a plurality of correction lenses each having a different focal length are circumferentially arranged. Then, it is arranged, when the turret 14A2 is rotated by an exchange control system 23 which is interlocked with the change control system 20 and the movement control system 21, a desired correction lens can be set in an illumination light path. Accordingly, also in the third embodiment, when the turret 14A2 is rotated by the exchange optical system 23 so that a lens for constituting a part of the condenser optical system is exchanged with another appropriate correction lens having a different focal length, a change of the back focus caused by a movement of the movable lens group 14B can be corrected, and the intensity distribution on the reticle blind RB and, in its turn, the distribution in the intensity of illumination on the reticle R or on the wafer W can be returned to substantially the same states as those prior to the change of the form or the size of the multiple light source.

Figure 12:
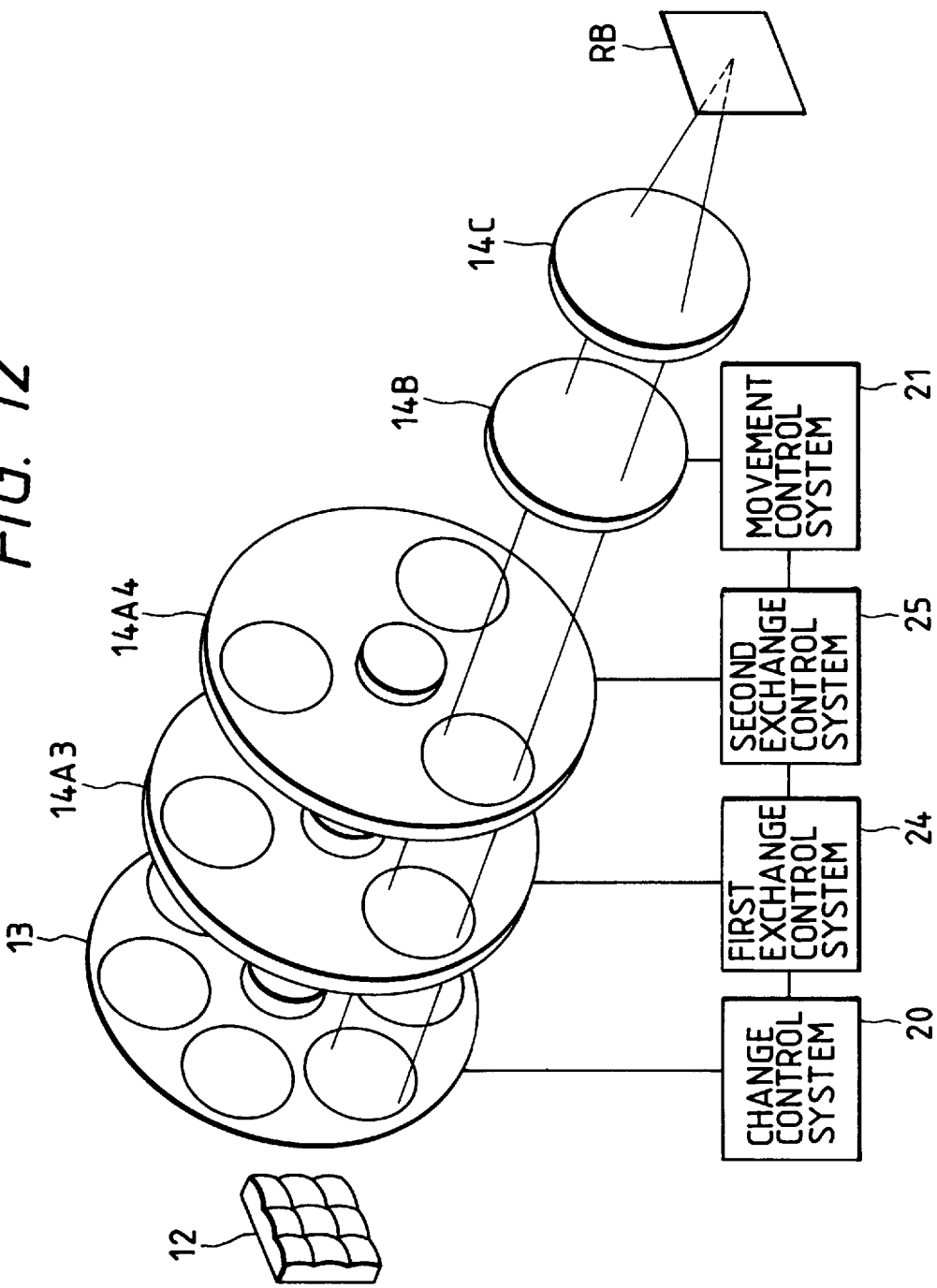
FIG. 12 is a view for schematically showing the structure of a main portion of the illumination optical system according to the fourth embodiment of the present invention.

FIG. 12 is a perspective view which schematically shows the structure of a main portion of an illumination optical system according to the fourth embodiment of the present invention.

The fourth embodiment has a similar structure to that of the third embodiment, except that there are provided two sets of turrets for exchanging lenses. Accordingly, components in FIG. 12 having the same functions as those of the third embodiment in FIG. 11 are given the same reference numerals and symbols as in FIG. 11. The fourth embodiment will be described below by paying attention to the difference from the third embodiment.

As shown in FIG. 12, there are provided a first turret 14A3 on which a plurality of first correction lenses having different focal lengths are circumferentially arranged and a second first turret 14A4 on which a plurality of second correction lenses having different focal lengths are circumferentially arranged in the illumination optical system of the fourth embodiment. Then, it is arranged, when the first turret 14A3 is rotated by a first exchange control system 24 and the second turret 14A4 by a second exchange control system 25, respectively, desired first correction and second correction lenses can be respectively set in the illumination light path. Also, it is arranged that the first exchange control system 24 and the second exchange control system 25 are interlocked with the change control system 20 and the movement control system 21.

Accordingly, also in the fourth embodiment, when a lens which constitutes a part of the condenser optical system on at least one of the first turret 14A3 and the second turret 14A4 is exchanged with another appropriate first correction lens or second correction lens having a different focal length, a change of the back focus caused by a movement of the movable lens group 14B can be corrected, and the intensity distribution on the reticle blind RB and, in its turn, the distribution in the intensity of illumination on the reticle R or on the wafer W can be returned to substantially the same states as those prior to the change of the form or the size of the multiple light source.

Note that, in case of the fourth embodiment, if three positive lenses are arranged on, for example, the first turret 14A3 and three negative lenses on the second turret 14A3, a combination of the total six lenses is equivalent in function to an arrangement of nine lenses having different focal lengths on one turret. Accordingly, it is possible to correct a change in the optical characteristics with a higher accuracy than that in the third embodiment by use of correction lenses in a smaller number than that in the third embodiment.

Also, in the illumination optical system in the fourth embodiment shown in FIG. 12, a plurality of plane parallel plates having thicknesses different from each other may be circumferentially arranged on the first turret 14A3, and a plurality of correction lenses having focal lengths different from each other may be circumferentially arranged on the second turret 14A4. In this case, a change of the back focus can be corrected by exchanging the lenses on the second turret 14A4, and a change in the telecentricity can be corrected by exchanging the plane parallel plates on the first turret 14A3. In the same manner, a plurality of correction lenses having focal lengths different from each other may be circumferentially arranged on the first turret 14A3, and a plurality of plane parallel plates having thicknesses different from each other may be circumferentially arranged on the second turret 14A4, so that a change of the back focus and a change in the telecentricity can be corrected. Or, a plurality of correction lenses having focal lengths and thicknesses different from each other are circumferentially arranged on the first turret 14A3 and on the second turret 14A4, so that a change of the back focus and a change in the telecentricity can be corrected.

Also, in the illumination optical system of the third embodiment shown in FIG. 11, a plurality of plane parallel plates having thicknesses different from each other are circumferentially arranged on the turret 14A2, and the turret 14A2 is rotated to exchange the plane parallel plates, whereby a change in the telecentricity can be corrected.

Note that in the third and fourth embodiments, the focal length of a lens is changed by a rotation of the turret. However, a plurality of lenses having the focal lengths different from each other or a plurality of plane parallel plates having thicknesses different from each other, for example, may be horizontally arranged and exchanged by the so-called sliding method.

Further, in the fourth embodiment, by tilting the plane parallel plates arranged on the turret with respect to the optical axis, the tilt telecentricity can be corrected. In this case, a mechanism for tilting the plane parallel plates with respect to the turret may be provided inside the turret, or a mechanism for integrally tilting the plane parallel plates and the turret may be provided outside the turret.

Also, in the third and fourth embodiments, it is desirable that an arrangement of the focal length or the number of lenses on one turret, and the number of turrets, etc., should be properly determined in accordance with a change of the aperture form of the aperture stop 13, an amount of movement of the lens group 14B, etc.

Further, in the lens exchange in the second to fourth embodiments, a change in the telecentricity which is caused by a movement of the movable lens group 14B can be corrected by exchanging one lens with another proper lens having a different thickness.

Figure 22:
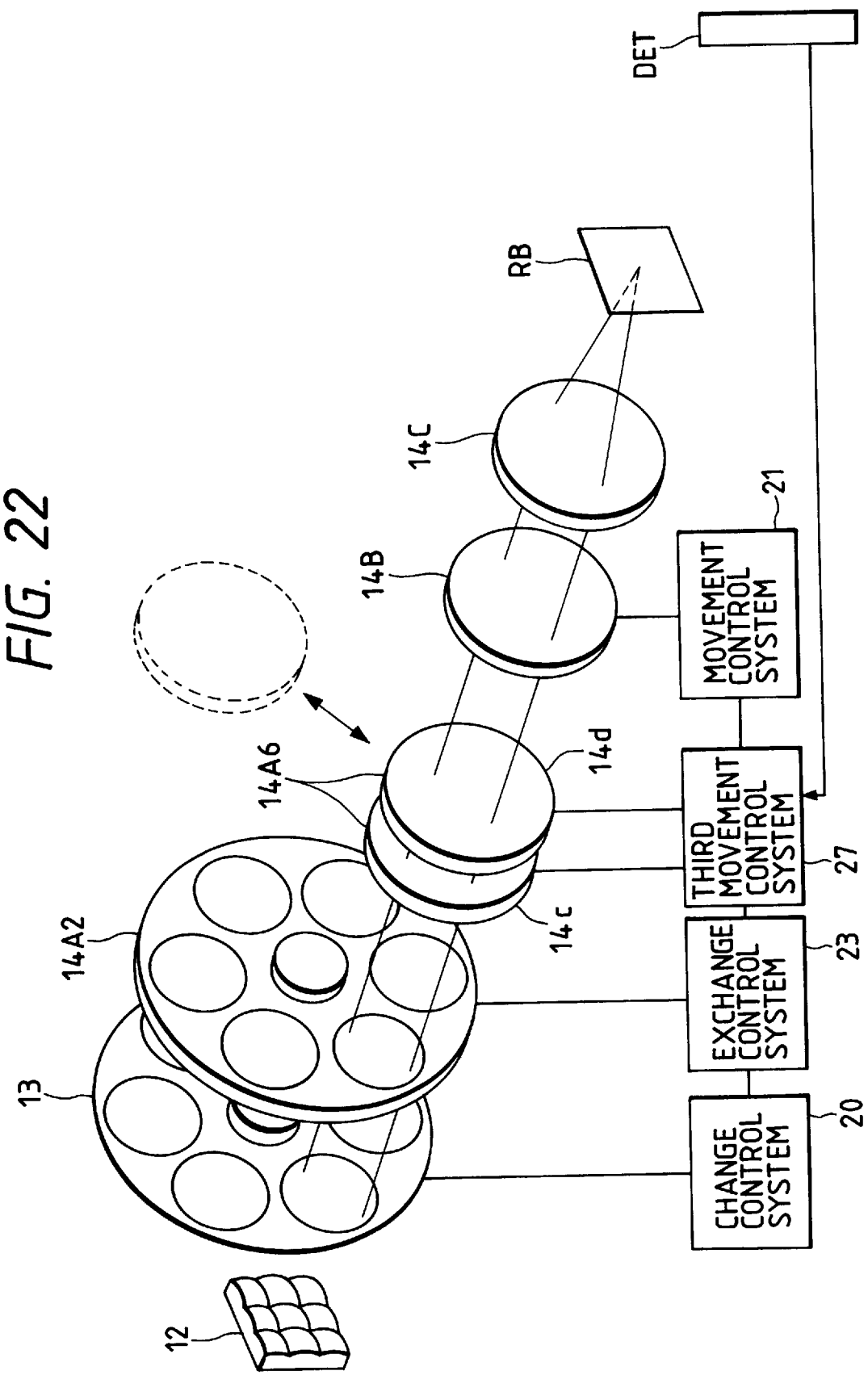
FIG. 22 is a view for schematically showing the structure of a main portion of the illumination optical system according to the fifth embodiment of the present invention.

FIG. 22 is a perspective view which schematically shows the structure of a main portion of an illumination optical system according to the fifth embodiment of the present invention.

The fifth embodiment has a similar structure to that of the third embodiment shown in FIG. 11, except that a change in the telecentricity of an illumination light on an irradiated plane is corrected by changing the light path length of an optical member 14A6 which is additionally provided between the turret 14A2 and the movable lens group 14B. Accordingly, components in FIG. 22 having the same functions as those of the third embodiment in FIG. 11 are given the same reference numerals and symbols as in FIG. 11. The fifth embodiment will be described below by paying attention to the difference from the third embodiment.

As shown in FIG. 22, in the illumination optical system of the fifth embodiment, there is provided an optical member 14A6 which has no refracting power as a whole and is constituted by a pair of plane parallel plates 14a and 14d between a turret 14A2 for correcting a change of the back focus of the condenser optical system and a movable lens group 14B. There is also provided a measuring device DET which measures the telecentricity of the illumination light on the irradiated plane. It is arranged that an output from the measuring device DET is supplied to a third movement control system 27 for driving the optical member 14A6. Then, the third movement control system 27 sets or retracts each of the pair of plane parallel plates 14c, 14d into or from an illumination light path, depending on a result of measurement conducted by the measuring device DET, thereby changing the optical light path of the optical member 14A6. The third movement control system 27 is arranged to be interlocked with the change control system 20 and the movement control system 23.

As stated, the third movement control system 27 constitutes a light path change device for changing the optical light path of the optical member 14A6 which substantially has no refracting power.

Note that the measuring device DET is a sensor having a known structure which employs, for example, a knife edge detecting method. More specifically, as disclosed in the specification and the drawings of Japanese Patent Application No. 8-67220, while a space image of a mask pattern projected on a knife edge through a projection optical system is relatively moved with the knife edge, a light from the space image is received by a light-receiving sensor, so as to detect an intensity distribution of the space image. Then, on the basis of the detected intensity distribution of the space image, the optical characteristics of the projection optical system, such as the telecentricity of an illumination light on an irradiated plane (the wafer surface) can be measured.

Also, as disclosed in Japanese Patent Laid-Open Application No. 8-264432, the Z-coordinate of an ISS (Imaging Slit Sensor) reference mark is successively changed with respect to an alignment sensor of the ISS scheme, whereby an amount of collapse of the telecentricity can be measured.

The principle of correcting a change in the telecentricity of the illumination light by changing the optical light length of the optical member 14A6 having no refracting power will be described with reference to FIGS. 23 to 25.

Figure 23:
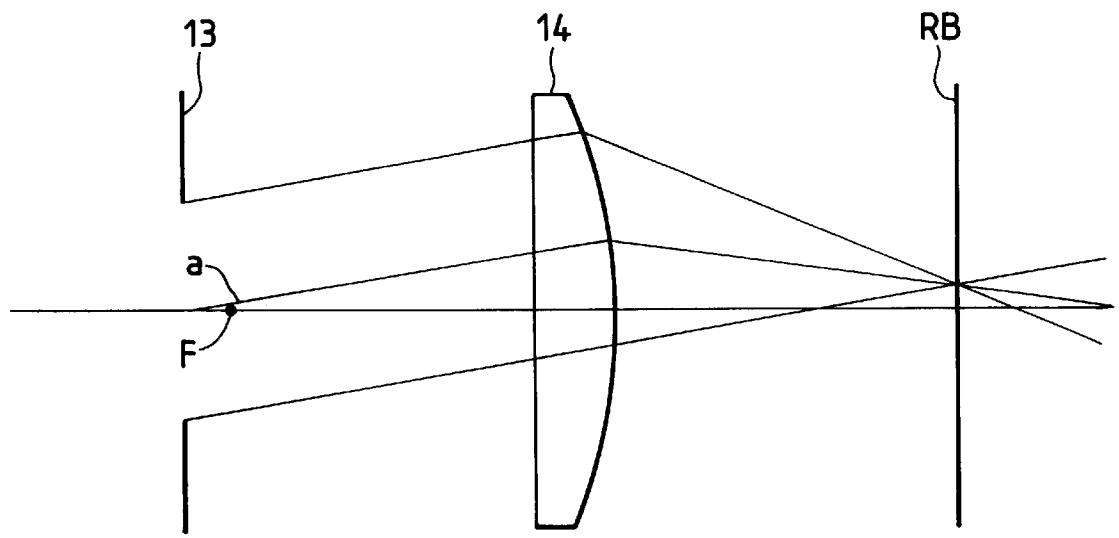
FIG. 23 is a view for showing a state in which the position of an aperture stop 13 is displaced from the front focal position F of a lens group 14 toward the optical integrator, in the fifth embodiment.

In FIG. 23, the position of the aperture stop 13 is displaced from the rear focal position F of lens group 14 toward the optical integrator (to the left in the drawing), owing to a movement of the movable lens group 14B, for example, for correcting an unevenness in the intensity of illumination. As a result, a chief ray a emitted from the lens group 14 is made not to parallel to the optical axis, and the telecentricity of the lens group 14 on the exit side, and in its turn, the telecentricity of the illumination light on the irradiated plane, change.

Figure 24:
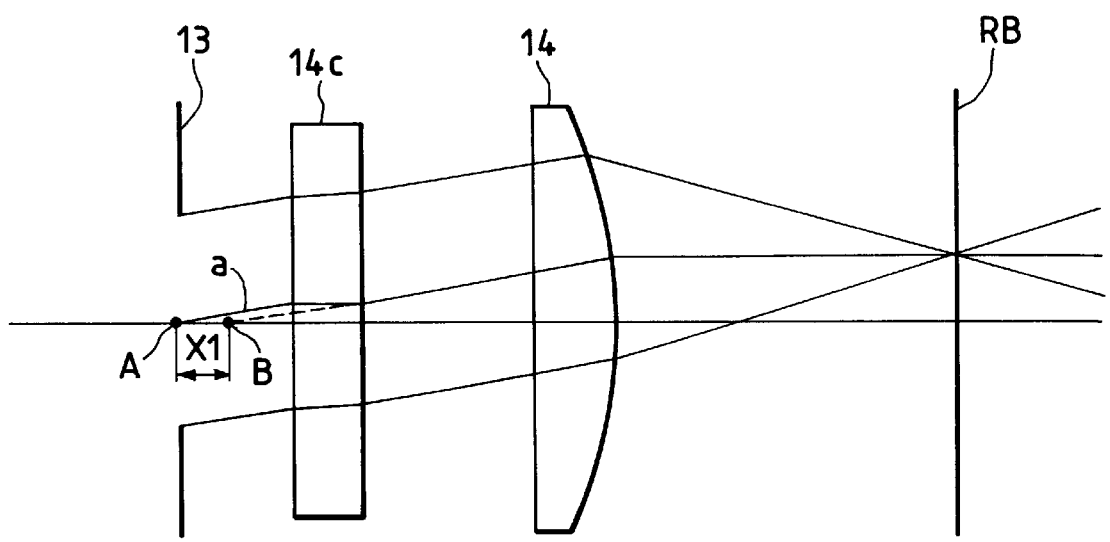
FIG. 24 is a view for showing a state in which a plane parallel plate 14c is inserted into a light path between the aperture stop 13 and the lens group 14, in the fifth embodiment.

FIG. 24 shows a state in which a plane parallel plate 14c is inserted into a light path between the aperture stop 13 and the lens group 14. As shown in FIG. 24, if the plane parallel plate 14c is inserted between the aperture stop 13 and the lens group 14, the position A of the entrance pupil of the lens group 14 (i.e., the position of the aperture stop 13) is moved into the apparent position B. In this case, if the thickness of the plane parallel plate 14c is d1 and the refractive index of the plane parallel plate 14c is n1, the distance X1 along the optical axis between the pupil position A and the apparent pupil position B is expressed by the following formula (1):

$$X1 = d1 - d1/n1 \qquad (1).$$

As stated above, if the plane parallel plate 14c is set in the illumination light path between the aperture stop 13 and the lens group 14, or it is retracted from the illumination light path, the apparent pupil position B of the lens group 14 is moved along the optical axis in accordance with the refractive index and the thickness of the plane parallel plate 14. Accordingly, if the plane parallel plate 14c having appropriate refractive index and thickness is set in the illumination light path or is retracted from the illumination light path, the apparent pupil position B of the lens group 14 can be substantially made to meet the front focal position F of the lens group 14. As a result, the chief ray a emitted from the lens group 14 is made substantially parallel to the optical axis, so that a change in the telecentricity of the illumination light on the irradiated plane can be corrected.

Figure 25:
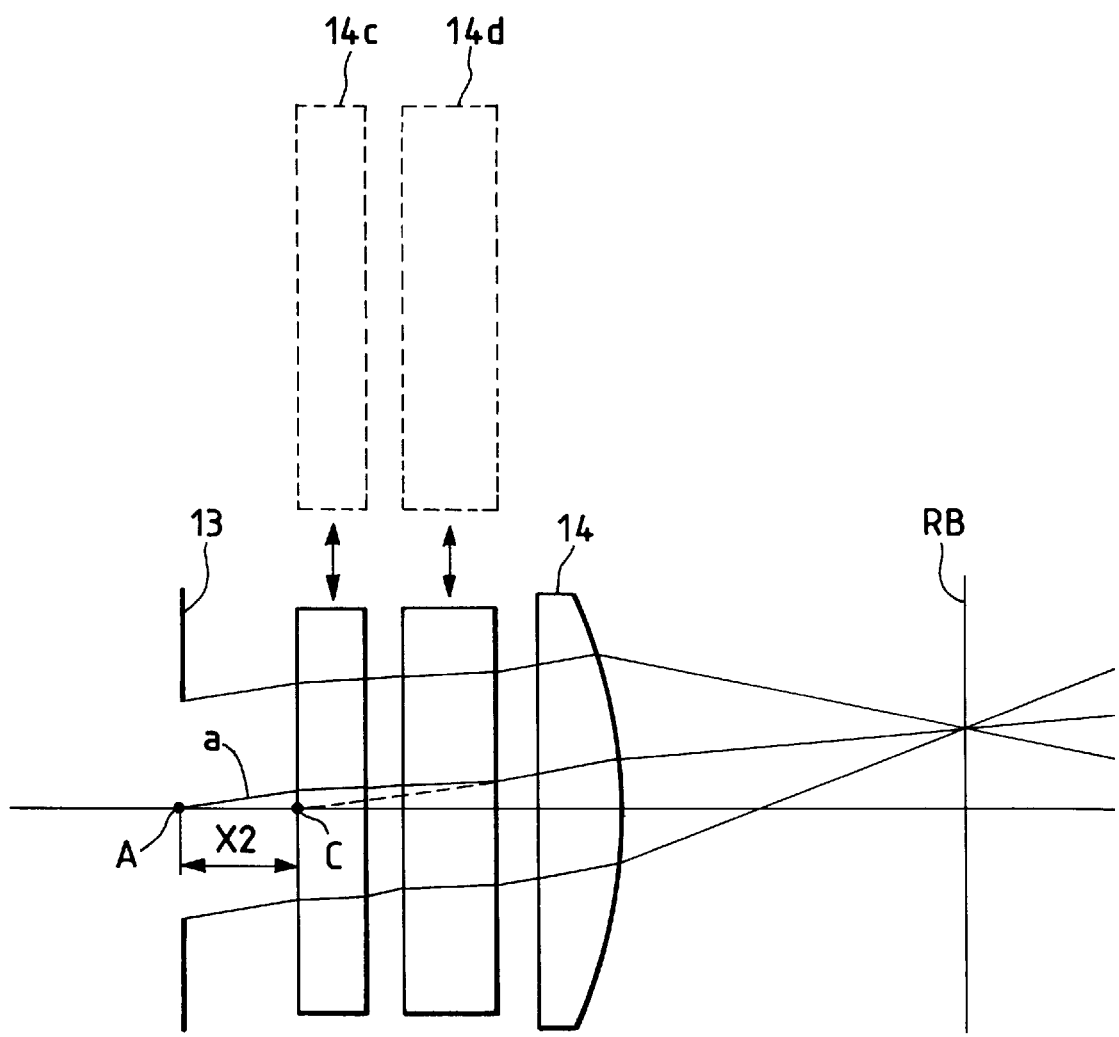
FIG. 25 is a view for showing a state in which, in addition to the plane parallel plate 14c, another plane parallel plate 14d is inserted into the light path between the aperture stop 13 and the lens group 14, in the fifth embodiment.

FIG. 25 shows a state in which another plane parallel plate 14d, in addition to the plane parallel plate 14c, is inserted into the light path between the aperture stop 13 and the lens group 14. In FIG. 25, the pupil position A of the lens group 14 is moved toward the apparent position C. In this case, if the thickness of the plane parallel plate 14d is d2, and the refractive index of the plane parallel plate 14d is n2, the distance X2 along the optical axis between the pupil position A and the apparent pupil position C is expressed by the following formula (2):

$$X2 = d1 - d1/n1 + d2 - d2/n2 \qquad (2).$$

the first state in which both of the plane parallel plates 14c and 14d are set in the illumination light path, the second state in which the plane parallel plate 14c is set in the illumination light path and the plane parallel plate 14d is retracted from the illumination light path, the third state in which the plane parallel plate 14d is set in the illumination light path and the plane parallel plate 14c is retracted from the illumination light path, or the fourth state in which both of the plane parallel plates 14c and 14d are retracted from the illumination light path can be realized depending on a combination of the two plane parallel plates which are detachably provided in the illumination light path. The apparent pupil position of the lens group 14 can be changed in four ways in accordance with the above-mentioned states. As a result, a change in the telecentricity of the illumination light on the irradiated plane can be satisfactorily corrected more easily than by the other method in which only one plane parallel plate is inserted/detached with respect to the light path.

Generally, when n pieces of plane parallel plates having different thicknesses from each other are used for the optical member 14A6, the optical light path length of the optical member 14A6 can be varied in 2n ways and the apparent pupil position of the lens group 14 can be varied in 2n ways by setting each of the plane parallel plates in the illumination light path or retracting it from the illumination light path. Here, if n pieces of plane parallel plates having the same refractive index and thicknesses different from each other are used, and if the thickness of the thinnest plane parallel plate is d, the plane parallel plates are preferably arranged to have the thicknesses d, 2d, $2^2$d, . . . , and $2^{n-1}$d, respectively. In this case, it is possible to successively vary the total thickness of the plane parallel plates set in the illumination light path in 2n ways including 0, d, 2d, . . . , ($2^n$–1), by setting each of the plane parallel plates in the illumination light path or retracting it from the illumination light path. As a result, the optical light length of the optical member 14A6 can be successively varied in 2n ways, so that a change in the telecentricity of the illumination light on the irradiated plane can be corrected with a higher accuracy.

As stated, in the fifth embodiment, when the optical light path of the optical member 14A6 is properly varied on the basis of a result of the measurement of the telecentricity which is sent from the measuring device DET, a change in the telecentricity caused by the movement of the movable lens group 14B can be satisfactorily corrected and a uniform distribution of the intensity of illumination can be obtained on the reticle R or on the wafer W.

Note that when the optical member 14A6 is provided in the condenser optical system, since the optical member 14A6 is positioned comparatively near the optical integrator, a change in the telecentricity of the illumination light on the irradiated plane can be effectively corrected by varying the optical light path length of the optical member 14A6. Specially, when the optical member 14A6 is positioned closest to the optical integrator in the condenser optical system as shown in FIG. 23 to 25, if a change in the telecentricity is corrected by an operation of the optical member 14A6 after a change of the back focus is corrected by an operation of the turret 14A2, only the change in the telecentricity of the illumination light on the irradiated plane can be corrected only with a change of the pupil position of the condenser optical system and with little influence onto the back focus or aberrations of the condenser optical system. Accordingly, as shown in FIG. 22, when the optical member 14A6 is set in the condenser optical system, it is desirable to set the optical member 14A6 at a position near the optical integrator as much as possible.

Figure 26:
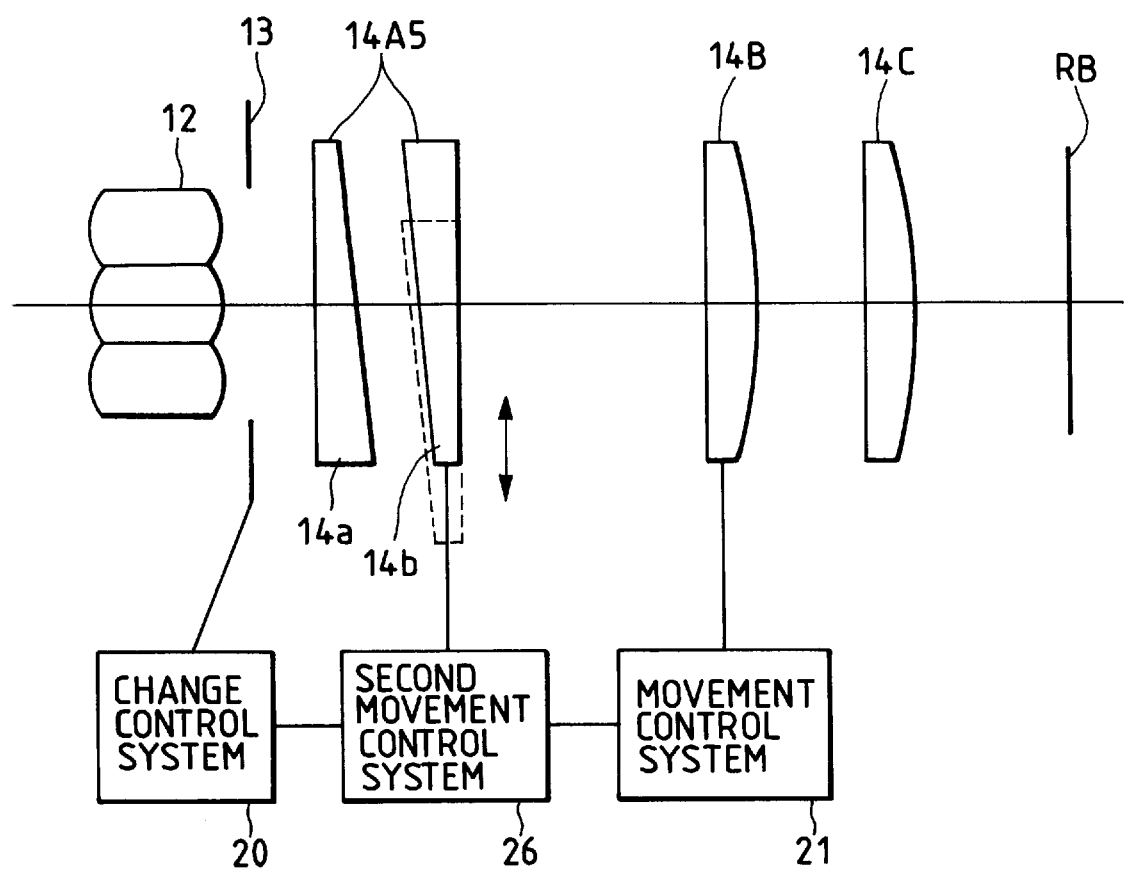
FIG. 26 is a view for schematically showing the structure of a main portion of an illumination optical system according to a modification of the fifth embodiment of the present invention.

FIG. 26 is a perspective view which schematically shows the structure of a main portion of an illumination optical system according to a modification of the fifth embodiment of the present invention.

This modification is different from the fifth embodiment basically only in that a change in the telecentricity of the illumination light on the irradiated plane is corrected by changing the light path length of an optical member which is constituted by a pair of declination prisms. Accordingly, components in FIG. 26 having the same functions as those of the fifth embodiment in FIG. 22 are given the same reference numerals and symbols as in FIG. 22. This modification will be described below by paying attention to the difference from the fifth embodiment.

As shown in FIG. 26, in the illumination optical system of this modification, a pair of declination prisms (wedge-shaped prisms) 14A5 is disposed between the aperture stop 13 and the movable lens group 14B in such a manner that the paired prisms have no refracting power as a whole. That is, the apex (the wedge angle) of the declination prism 14a which is disposed on the side of the aperture stop (in the left part of the drawing) is identical to the apex of the declination prism 14b which is disposed on the side of the irradiated plane (in the right part of the drawing). In addition, the plane of the declination prism 14a on the side of the aperture stop and the plane of the declination prism 14b on the irradiated plane are both disposed to be perpendicular to the optical axis, and the plane of the declination prism 14a on the side of the irradiated plane and the plane of the declination prism 14b on the aperture stop are disposed to be parallel to each other. Then, when the declination prism 14b is moved to a direction perpendicular to the optical axis by the second movement control system 26, the optical light path length of the paired declination prisms 14A5 can be changed. Also, the second movement control system 26 is arranged to be interlocked with the change control system 20 and the movement control system 21.

As stated above, the second movement system 26 constitutes a light path change device for changing the optical light path length of the paired declination prisms 14A5.

Accordingly, in this modification, when the optical light path length of the paired declination prisms 14A5 is changed by moving the declination prism 14b to the direction perpendicular to the optical axis by use of the second movement control system 26 in accordance with a change of the form or the size of the multiple light source, a change in the telecentricity which is caused by the movement of the movable lens group 14B can be corrected, and at the same time, a uniform distribution of the intensity of illumination can be obtained on the reticle R and on the wafer W. Also, in the same manner as in the fifth embodiment, when the optical light path length of the paired declination prisms 14A5 is changed, only a change in the telecentricity of the illumination light on the irradiated plane can be corrected without giving much influence on the back focus or aberrations of the condenser optical system.

Note that, in this modification, only the declination prism 14b is moved to a direction perpendicular to the optical axis. However, only the declination prism 14a may be moved to a direction perpendicular to the optical axis, or the declination prism 14a and the declination prism 14b may be moved to directions opposite to each other.

Further, in the second to fifth embodiments and in the modification of the fifth embodiment, a turret may be disposed on the light source side of the optical integrator 12, and a plurality of filters for correcting a change of optical characteristics such as an unevenness in the intensity distribution may be disposed circumferentially on this turret. In this case, not only an unevenness in the intensity of illumination which is revolutionary symmetrical with respect to the optical axis, but also a change of the optical characteristics including a rotationally asymmetrical unevenness in the inclination can be dealt with by setting an appropriate filter on the turret in the illumination light path interlockingly with a change of the aperture form of the aperture stop 13 (i.e., a change of the form or the size of the multiple light source).

Next, description will be made on a case in which an illumination optical system of the present invention is applied to an exposure apparatus of a so-called scan exposure type wherein a mask pattern is scan-exposed in each exposure area on the wafer when the mask and the wafer are relatively moved.

Figure 17:
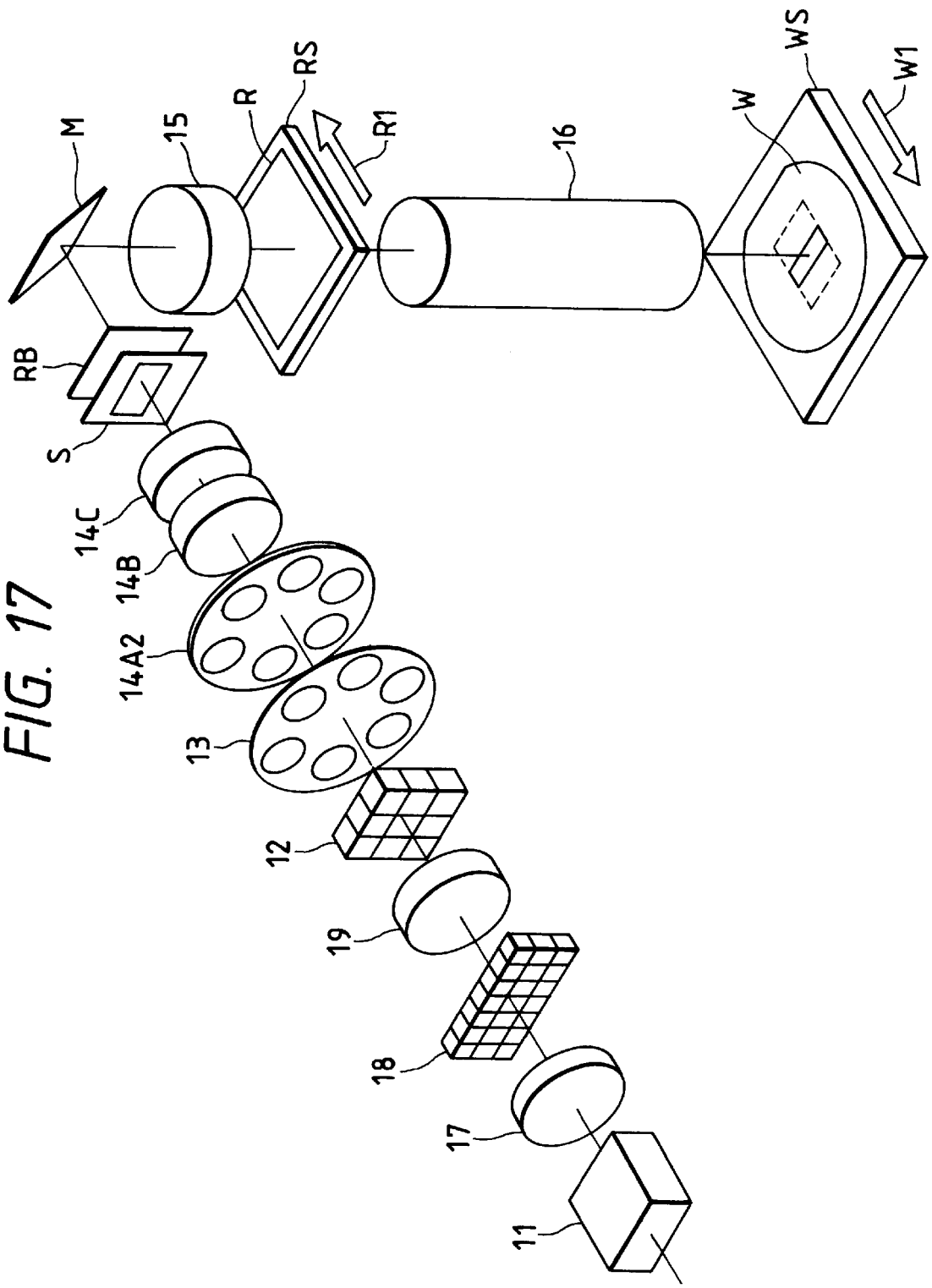
FIG. 17 is a perspective view for schematically showing the structure of an exposure apparatus of a scanning exposure type into which the illumination optical system according to the third embodiment of the present invention is incorporated.

FIG. 17 is a perspective view for schematically showing the structure of the exposure apparatus of the scan-exposure type into which the illumination optical system according to the third embodiment of the present invention is incorporated. In the apparatus shown in FIG. 17, a second optical integrator is further disposed on the light source side of a first optical integrator.

In the illustrated exposure apparatus, an illumination light from a light source 1 such as a laser light source is incident on the first optical integrator 18 through a lens group 17. The light ray incident on the second optical integrator 18 is two-dimensionally divided by a plurality of lens elements, so as to from on the rear focal plane side thereof a secondary light source which is constituted by a plurality of light source images.

The light ray from the secondary light source which is formed by the second optical integrator 18 is converted into collimated light rays by a lens group 19, so as to illuminate the incident plane of an optical integrator 12 in an overlapping manner. The collimated light rays incident on the optical integrator 12 are divided by a plurality of lens elements, and a multiple light source (the tertiary light source) which is constituted by light source images in the number equal to the product of the number of the lens elements of the second optical integrator 18 and the number of the lens elements of the optical integrator 12 on the rear focal plane of the optical integrator 12.

The light from the multiple light source which is formed by the optical integrator 12 is controlled by the aperture stop 13 disposed in the vicinity of the rear focal plane of the optical integrator 12, and then enters the condenser optical system.

The light incident on the condenser optical system is condensed through a lens of a turret 14A2, a movable lens group 14B, and a lens group 14C, and then controlled by a fixed slit S having a rectangular aperture portion. After that, the condensed light enters the reticle blind RB. The light coming through the reticle blind RB is deflected by a mirror M, and then, illuminates the reticle R on which a circuit pattern to be transferred is formed in an overlapping manner through a lens group 15 for constituting a part of the condenser optical system. The light passed through the pattern of the reticle R is imaged on the wafer W which serves as a photosensitive substrate via a projection optical system 16.

Note that the reticle R is supported on a reticle stage RS along a direction indicated by an arrow R1 on a plane perpendicular to the optical axis of the projection optical system 16. On the other hand, the wafer W is supported by a wafer stage WS which is two-dimensionally movable on a plane perpendicular to the optical axis of the projection optical system 16. Thus, the wafer stage WS is moved to a direction indicated by an arrow W1 while the reticle stage RS is moved to the direction indicated by the arrow R1, that is, a scan exposure is performed while the reticle R and the wafer W are relatively moved in opposite directions to each other, whereby a pattern of the reticle R is transferred onto each exposure area of the wafer W.

As shown in FIG. 17, in an exposure apparatus of the scan-exposure type, the fixed slit S is disposed at a position separated away from the reticle blind RB to the light source by a slight distance, in order to reduce a dynamic unevenness in an exposure amount. An influence of a change of the back focus on the intensity distribution on the reticle blind RB when the fixed slit S is not provided, as in the above-mentioned embodiments, is different from that when the fixed slit S is not provided in the scan exposure. Description will be made below on the influence on the intensity distribution on the reticle blind RB, which is given by a change of the back focus caused the movement of the movable lens group 14B, with reference to FIGS. 18 to 21.

Figure 18:
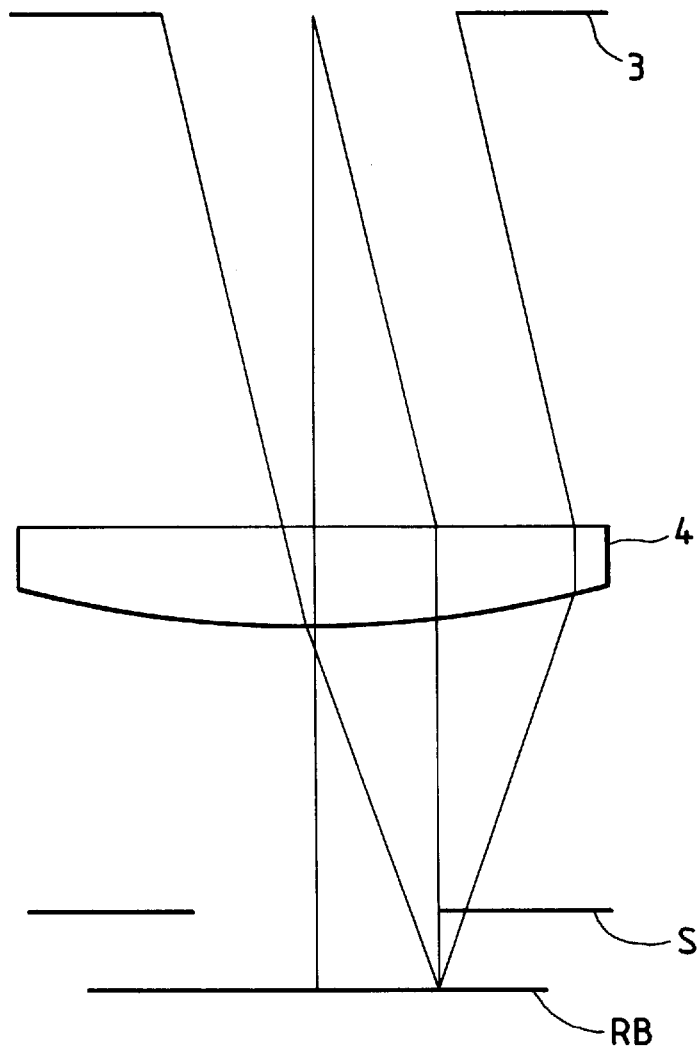
FIG. 18 is a view for showing the exposure apparatus of a scanning exposure type, in a condition prior to the change of the form or the size of the multiple light source.
Figure 19:
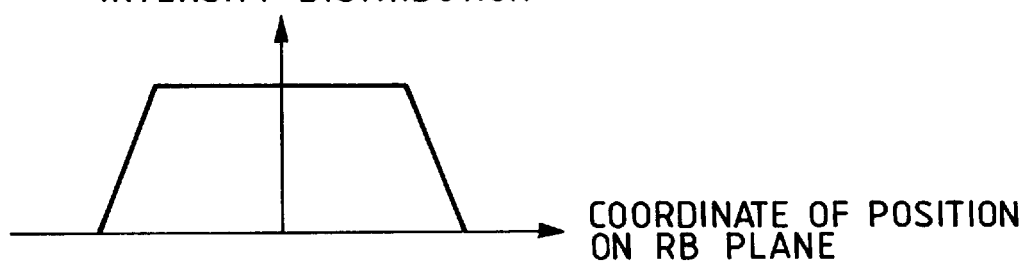
FIG. 19 is a view for showing an intensity distribution on a reticle blind RB in the condition shown in FIG. 18.

Referring to FIG. 18, when the back focus of the lens group 14 is adjusted such that the rear focal point of the lens group 14 is positioned on the reticle blind RB, the intensity distribution on the reticle blind RB is limited by the fixed slit S to take the form of a trapezoid which is suitable for the scan exposure.

Figure 20:
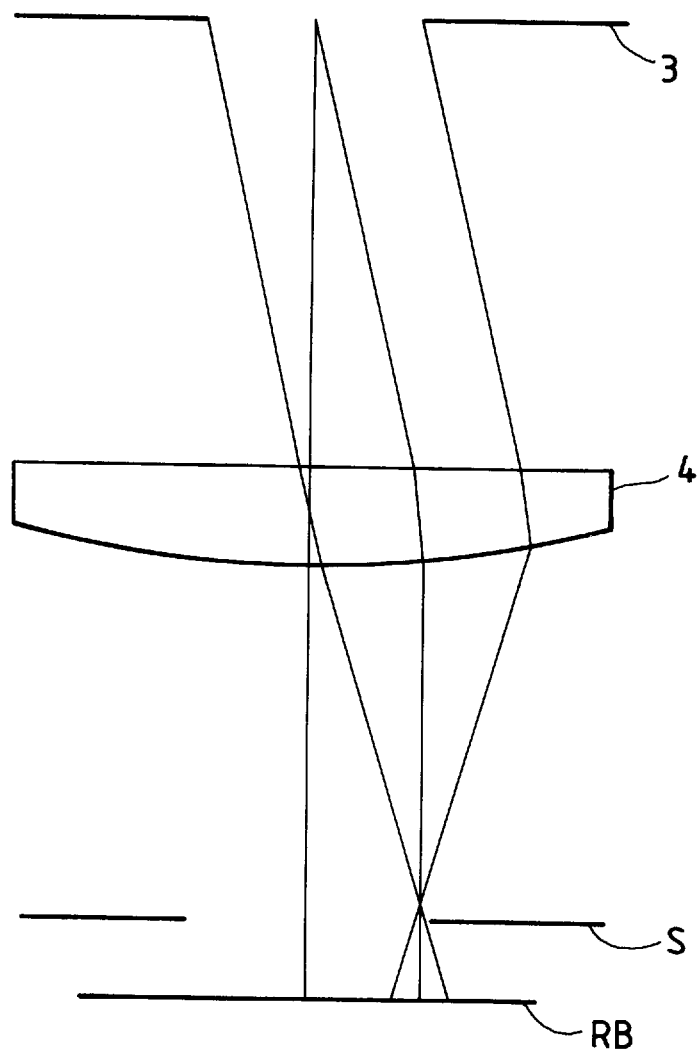
FIG. 20 is a view for showing the exposure apparatus of a scanning exposure type, in a condition after the change of the form or the size of the multiple light source.
Figure 21:
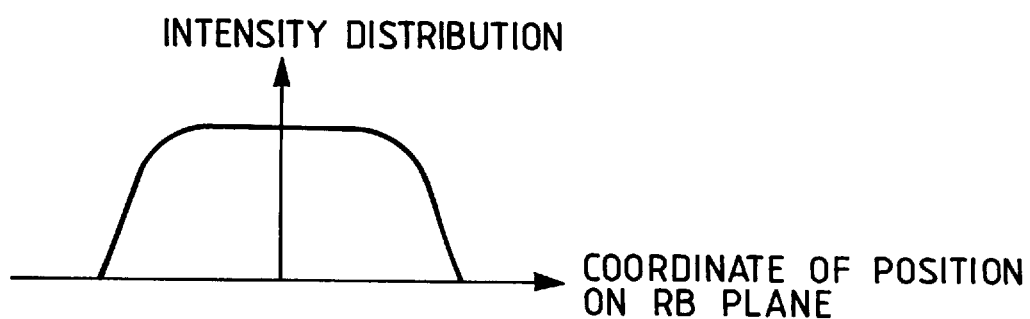
FIG. 21 is a view for showing an intensity distribution on a reticle blind RB in the condition shown in FIG. 20.

However, when the back focus of the lens group 14 is changed due to the movement of the movable lens group 14B which corrects an unevenness in the intensity of illumination, the rear focal point of the lens group 14 is displaced from the reticle blind RB, as shown in FIG. 20. As a result, as shown in FIG. 21, with respect to the intensity distribution on the reticle blind RB, the corners of the trapezoid are rounded to indicate an unevenness in the distribution. The unevenness in the intensity distribution on the reticle blind RB reflects on the distribution of the intensity of illumination on the reticle R and on the wafer W.

In the exposure apparatus of the scan exposure type shown in FIG. 17, when the turret 14A2 is rotated to exchange the lens which constitutes a part of the condenser optical system with another proper correction lens which has a different focal length, a change of the back focus generated due to the movement of the movable lens group 14B is corrected so that the intensity distribution on the reticle blind RB and, in its turn, the distribution of the intensity of illumination on the reticle R and on the wafer W can be returned to the states prior to the change of the form or the size of the multiple light source. As a result, it is possible to maintain a uniform distribution of the intensity of illumination on the wafer W, thereby performing a high-precision projection exposure.

Since the reticle R can be illuminated by the exposure apparatus shown in each of the foregoing embodiments much more uniformly than in the conventional apparatus, an excellent reticle pattern can be projection-exposed on the wafer W which serves as a photosensitive substrate through the projection optical system. Then, the wafer which has undergone an exposure step by the exposure apparatus of the second embodiment (the photolithographic step) further undergoes a developing step, an etching step for removing a part other than the developed resist, and then, a resist removal step for removing unnecessary resist after the etching step, whereupon the wafer process is completed. Then, upon completion of the wafer process, an actual assembling process including a dicing step for cutting the wafer into chips for each printed circuit, a bonding step for providing a wire, etc., to each chip, and packaging step for packaging each chip are performed to manufacture a semiconductor device (an LSI, or the like) as a finished device.

Note that the above description was made on a case in which a semiconductor device is manufactured by the photolithographic step in the wafer process using the projection exposure apparatus. However, semiconductor devices such as a liquid crystal display device, a thin film magnetic head, and an image pick-up device (a CDD, or the like) can be manufactured by the photolithographic step using an exposure apparatus.

When a semiconductor device is thus manufactured by using the illumination optical system according to the present invention, it is possible to perform a projection exposure with a high accuracy by maintaining a uniform distribution of the intensity of illumination on a photosensitive substrate and an excellent telecentricity of the exposure light, so that an excellent semiconductor device can be manufactured.

In each of the foregoing embodiments, the form or the size of the multiple light source is changed by changing the aperture form of the aperture stop. However, as disclosed in Japanese Patent laid-Open Application No. 4-225514, it is possible to change the form or the size of the multiple light source by changing the sizes of the four eccentric light sources, or by properly changing the forms of the optical integrators or a combination thereof. The present invention is effective for correction of a fluctuation in the distribution of the intensity of illumination caused by a change of the form or the size of the multiple light source, regardless of method for changing thereof.

Further, in each of the foregoing embodiments, the present invention was described by using a projection exposure apparatus with an illumination optical system as an example. However, it is clearly seen that the present invention can be applied to an exposure apparatus of the proximity scheme, or an ordinary illumination optical system for uniformly illuminating a plane to be irradiated other than a mask.

Also, in each of the foregoing embodiments, a fly-eye lens which is constituted by a plurality of lens elements tied up in a bundle is used as the optical integrator. However, a rod-shaped optical member of a inner-plane reflection type may be used, instead.

Also, each of the foregoing embodiments shows a case in which at least a certain optical system which is a part of the condenser optical system is moved to the direction of the optical axis in accordance with a change of the size or the form of each of a plurality of light source images which are formed by the optical integrator, by way of example. However, the present invention is not limited to such case, and it is possible to replace at least a certain optical system which is a part of the condenser optical system with an optical system with a different focal length, by use of a turret, or the like. Also, in each of the foregoing embodiments, in order to simplify the structure of the condenser optical system, at least a certain optical system which is a part of the condenser optical system is replaced with an optical system having a different focal length by use of a turret or the like so as to suppress a fluctuation in the back focus or the like of the condenser optical system. However, if there is no need to simplify the structure of the condenser optical system, such structure may be employed in which the focal length of the condenser optical system can be successively changed, that is, a fluctuation in the back focus or the like of the condenser optical system is suppressed with intention of using the condenser optical system as a zoom lens.

As described above, in the illumination optical system of the present invention and the exposure apparatus provided with the optical system, at least one lens out of a plurality of lenses for constituting the condenser optical system is moved along the optical axis, so that a fluctuation in the distribution of the intensity of illumination caused by a change of the form or the size of the secondary light sources can be corrected.

Further, in the illumination optical apparatus of the present invention, it is possible to properly correct the back focus of the condenser optical system or a change in the telecentricity of the illumination light on the irradiated plane only by exchanging optical systems or optical members for constituting a part of the condenser optical system. Thus, it is possible to constantly maintain a uniform distribution of the intensity of illumination or an excellent telecentricity on the irradiated plane.

Accordingly, in the exposure apparatus in which the illumination optical system of the present invention is incorporated, a uniform distribution of the intensity of illumination and an excellent telecentricity of the exposure light can be maintained on the photosensitive substrate, so as to perform a projection exposure with a high precision. Also, when manufacturing a semiconductor device by using the illumination optical system of the present invention, the projection exposure with a high precision can be performed by maintaining a uniform distribution of the intensity of illumination and an excellent telecentricity of the exposure light on the photosensitive substrate, so that an excellent semiconductor device can be manufactured.

What is claimed is:

1. An illumination optical system comprising:
   a multiple light source forming system, which forms a multiple light source based on a light ray from a light source;
   a change system which changes a form or the size of the multiple light source formed by said multiple light source forming system; and
   a condenser optical system which illuminates a plane to be irradiated in an overlapping manner by condensing a light ray from the multiple light source having a form or a size changed by said change system,
   wherein at least certain optical elements of said condenser optical system are moved in accordance with the change of the form or the size of the multiple light source made by said change system in such a manner that a distribution of an intensity of illumination on the irradiated plane becomes substantially uniform.

2. An illumination optical system according to claim 1, wherein said multiple light source is formed using an optical integrator which is constituted by a multiplicity of lens elements and said change system has a variable aperture stop which has a variable aperture for setting the multiple light source formed by said optical integrator to have a predetermined form or a predetermined size.

3. A method for manufacturing a semiconductor device by use of an illumination optical system according to claim 2, including a step of exposing a pattern of a mask which is disposed on said irradiated plane onto the photosensitive substrate.

4. A method for manufacturing a semiconductor device by use of an illumination optical system according to claim 1, including a step of exposing a pattern of a mask which is disposed on said irradiated plane onto the photosensitive substrate.

5. An illumination optical system according to claim 1, further comprising:
   a correction unit which corrects at least one of a change of a back focus of said condenser optical system and a change in the telecentricity of said condenser optical system caused by the movement of said at least certain optical elements of said condenser optical system.

6. A method for manufacturing a semiconductor device by use of an illumination optical system according to claim 5, including a step of exposing a pattern of a mask which is disposed on said irradiated plane onto the photosensitive substrate.

7. An exposure apparatus for forming a pattern image of a mask, having a predetermined pattern formed thereon, on a photosensitive substrate, said exposure apparatus comprising:
   an illumination optical system which illuminates the mask, said illumination optical system having a multiple light source forming system which forms a multiple light source based on a light ray from a light source;
   a change system which changes a form or a size of the multiple light source formed by said multiple light source forming system; and
   a condenser optical system which illuminates a plane to be irradiated in an overlapping manner by condensing a light ray from the multiple light source having the form or the size changed by said change system,
   wherein at least certain optical elements of said condenser optical system are moved in accordance with the change of the form or the size of the multiple light source made by said change system in such a manner that the distribution of the intensity of illumination on the irradiated plane becomes substantially uniform.

8. An exposure apparatus according to claim 3, wherein said multiple light source is formed using an optical integrator which is constituted by a multiplicity of lens elements, and said change system has a variable aperture stop which has a variable aperture for setting the multiple light source formed by said optical integrator to have a predetermined form or a predetermined size.

9. An exposure apparatus according to claim 7, further comprising:
   a correction unit which corrects at least one of a change of a back focus of said condenser optical system and a change in the telecentricity of said condenser optical system caused by the movement of said at least certain optical elements of said condenser optical system.

10. An exposure apparatus comprising:
    a light source device which supplies a light ray;
    an optical integrator which forms a multiple light source constituted by a plurality of light source images based on the light ray from said light source device;
    a change device which changes a form or a size of the multiple light source formed by said optical integrator;
    a condenser optical system which illuminates a plane to be irradiated in an overlapping manner by condensing a light ray from the multiple light source having the form or the size changed by said change device;
    a projection optical system which performs a projection exposure of a pattern on the mask onto a photosensitive substrate;
    a first correction device which corrects unevenness in an intensity of illumination generated on the mask or on the photosensitive substrate due to the change of the form or the size of the multiple light source made by said change device; and
    a second correction device which corrects at least one of a change of a back focus of said condenser optical system and a change in a telecentricity of the illumination light on the mask or on the photosensitive substrate caused by the correcting operation of said first correction device.

11. An exposure apparatus according to claim 10 wherein a second optical integrator is provided to form a multiple light source constituted by a plurality of light source images between said light source device and said optical integrator based on the light ray from said light source device, and wherein the light from the multiple light source formed by said second optical integrator is guided to said optical integrator, which is arranged at a position closer to the mask than said second optical integrator.

12. An illumination optical system comprising:
a light source device which supplies a light ray;
an optical integrator which forms a multiple light source constituted by a plurality of light source images based on the light ray from said light source device; p1 a change device which changes a form or a size of the multiple light source formed by said optical integrator;
a condenser optical system which illuminates a plane to be irradiated in an overlapping manner by condensing a light ray from the multiple light source having the form or the size changed by said change device;
a first correction device which corrects unevenness in an intensity of illumination generated on the irradiated plane due to the change of the form or the size of the multiple light source made by said change device; and
a second correction device which corrects at least one of a change of a back focus of said condenser optical system and a change in the telecentricity of the illumination light on said irradiated plane caused by the correcting operation by said first correction device.

13. An illumination optical system according to claim 12, wherein said first correction device corrects the unevenness in the intensity of illumination by moving a first optical system which constitutes a first portion of said condenser optical system along the optical axis of said condenser optical system, and said second correction device corrects the change of the back focus of said condenser optical system by changing a focal length of a second optical system which constitutes a second portion of said condenser optical system and which is different from said first optical system.

14. An illumination optical system according to claim 6, wherein said second optical system comprises an exchange device which has a plurality of back focus correction optical systems each having a different focal length, and which sets one of said plurality of back focus correction optical systems in an illumination light path.

15. An illumination optical system according to claim 14, wherein said exchange device comprises a first exchange portion which has a plurality of first correction lenses each having a different focal length and which sets one of said plurality of first correction lenses in the illumination light path, and a second exchange portion which has a plurality of second correction lenses each having a different focal length and which sets one of said plurality of second correction lenses in the illumination light path.

16. A method for manufacturing a semiconductor device by use of an illumination optical system according to claim 15, including a step of exposing a pattern of a mask which is disposed on said irradiated plane onto the photosensitive substrate.

17. A method for manufacturing a semiconductor device by use of an illumination optical system according to claim 14, including a step of exposing a pattern of a mask which is disposed on said irradiated plane onto the photosensitive substrate.

18. An illumination optical system according to claims 13, wherein said second correction device comprises a light path length change device which changes an optical light path length of an optical member for constituting a third portion of said condenser optical system different from said first optical system and said second optical system, and which corrects a change in the telecentricity of the illumination light on said irradiated plane by changing the optical light path length of said optical member by use of said optical light path length change device.

19. An illumination optical system according to claim 18, wherein said light path length change device has a plurality of light path length correction optical members each having a different thickness and sets one of said light path length correction members, in the illumination light path.

20. A method for manufacturing a semiconductor device by use of an illumination optical system according to claim 19, including a step of exposing a pattern of a mask which is disposed on said irradiated plane onto the photosensitive substrate.

21. An illumination optical system according to claim 18, wherein said optical member has at least one plane parallel plate which is selectively positioned in the illumination light path, and said light path length change device sets/retracts said at least one plane parallel plate in/from the illumination light path.

22. An illumination optical system according to claim 21, wherein said optical member has n plane parallel plates each having the same refractive index and a thickness of d, 2d, $2^2 d, \ldots$, and $2^{n-1}d$, respectively, the thickness of the thinnest plane parallel plate being d.

23. A method for manufacturing a semiconductor device by use of an illumination optical system according to claim 22, including a step of exposing a pattern of a mask which is disposed on said irradiated plane onto the photosensitive substrate.

24. A method for manufacturing a semiconductor device by use of an illumination optical system according to claim 21, including a step of exposing a pattern of a mask which is disposed on said irradiated plane onto the photosensitive substrate.

25. An illumination optical system according to claim 18, wherein said optical member has a pair of declination prisms which are disposed in the illumination light path in order to have no refracting power as a whole, and said optical light path length change device causes at least one of said paired declination prisms to move along a direction perpendicular to an optical axis of said condenser optical system.

26. A method for manufacturing a semiconductor device by use of an illumination optical system according to claim 25, including a step of exposing a pattern of a mask which is disposed on said irradiated plane onto the photosensitive substrate.

27. A method for manufacturing a semiconductor device by use of an illumination optical system according to claim 18, including a step of exposing a pattern of a mask which is disposed on said irradiated plane onto the photosensitive substrate.

28. An illumination optical system according to claim 18, wherein a second optical integrator is provided to form a multiple light source consisting of a plurality of light source images between said light source device and said optical integrator based on the light ray from said light source device, and the light from the multiple light source formed by said second optical integrator is guided to said optical integrator, which is arranged at a position closer to the irradiated plane than said second optical integrator.

29. A method for manufacturing a semiconductor device by use of an illumination optical system according to claim 13, including a step of exposing a pattern of a mask which is disposed on said irradiated plane onto the photosensitive substrate.

30. An illumination optical system according to claim 12, wherein said first correction device corrects the unevenness of the intensity of illumination by moving a first optical system for constituting a first portion of said condenser optical system along an optical axis of said condenser optical system, and said second correction device corrects the change in the back focus of said condenser optical system and corrects the change in the telecentricity of the illumination light on said irradiated plane by changing a focal length of a second optical system for constituting a second portion of said condenser optical system different from said first optical system and by changing an optical light path length of said second optical system.

31. An illumination optical system according to claim 30, wherein said second optical system comprises an exchange device which has a plurality of correction optical systems each having a different focal length and a different optical light path length and which sets one of said plurality of correction optical systems in the illumination light path.

32. An illumination optical system according to claim 31, wherein said exchange device comprises a first exchange portion which has a plurality of first correction lenses each having a different focal length and a different optical light path length and which sets one of said plurality of first correction lenses in the illumination light path, and a second exchange portion which has a plurality of second correction lenses each having a different focal length and a different optical light path length, and which sets one of said plurality of second correction lenses in the illumination light path.

33. A method for manufacturing a semiconductor device by use of an illumination optical system according to claim 32, including a step of exposing a pattern of a mask which is disposed on said irradiated plane onto the photosensitive substrate.

34. A method for manufacturing a semiconductor device by use of an illumination optical system according to claim 31, including a step of exposing a pattern of a mask which is disposed on said irradiated plane onto the photosensitive substrate.

35. A method for manufacturing a semiconductor device by use of an illumination optical system according to claim 30, including a step of exposing a pattern of a mask which is disposed on said irradiated plane onto the photosensitive substrate.

36. An illumination optical system according to claim 21 to, wherein a second optical integrator is provided to form a multiple light source consisting of a plurality of light source images between said light source device and said optical integrator based on the light ray from said light source device, and the light from the multiple light source formed by said second optical integrator is guided to said optical integrator, which is arranged at a position closer to the irradiated plane than said second optical integrator.

37. A method for manufacturing a semiconductor device by use of an illumination optical system according to claim 36, including a step of exposing a pattern of a mask which is disposed on said irradiated plane onto the photosensitive substrate.

38. An illumination optical system according to claim 12, wherein said second correction device comprises a light path length change device which changes an optical light path length of an optical member for constituting a part of said condenser optical system, and which corrects a change in the telecentricity of the illumination light on said irradiated plane by changing the optical light path length of said optical member by use of said optical light path length change device.

39. An illumination optical system according to claim 38, wherein said optical member has at least one plane parallel plate which is selectively positioned in the illumination light path, and said light path length change device sets/retracts said at least one plane parallel plate in/from the illumination light path.

40. An illumination optical system according to claim 39, wherein said optical member has n plane parallel plates each having the same refractive index and a thickness of d, 2d, $2^2 d, \ldots,$ and $2^{n-1}d$, respectively, the thickness of the thinnest plane parallel plate being d.

41. A method for manufacturing a semiconductor device by use of an illumination optical system according to claim 40, including a step of exposing a pattern of a mask which is disposed on said irradiated plane onto the photosensitive substrate.

42. A method for manufacturing a semiconductor device by use of an illumination optical system according to claim 39, including a step of exposing a pattern of a mask which is disposed on said irradiated plane onto the photosensitive substrate.

43. A method for manufacturing a semiconductor device by use of an illumination optical system according to claim 38, including a step of exposing a pattern of a mask which is disposed on said irradiated plane onto the photosensitive substrate.

44. A method for manufacturing a semiconductor device by use of an illumination optical system according to claim 12, including a step of exposing a pattern of a mask which is disposed on said irradiated plane onto the photosensitive substrate.

* * * * *